United States Patent [19]
Lebel et al.

[11] Patent Number: 5,081,297
[45] Date of Patent: Jan. 14, 1992

[54] SOFTWARE RECONFIGURABLE INSTRUMENT WITH PROGRAMMABLE COUNTER MODULES RECONFIGURABLE AS A COUNTER/TIMER, FUNCTION GENERATOR AND DIGITIZER

[75] Inventors: Joseph A. Lebel, New Hyde Park; Charles D. Albrecht, Commack; Kar Kui Mark, Rosedale; Michael Ugenti, Melville, all of N.Y.

[73] Assignee: Grumman Aerospace Corporation, Bethpage, N.Y.

[21] Appl. No.: 321,187

[22] Filed: Mar. 9, 1989

Related U.S. Application Data

[63] Continuation-in-part of Ser. No. 860,158, May 6, 1986, abandoned.

[51] Int. Cl.$^5$ .............................................. H03K 21/00
[52] U.S. Cl. .................................... 395/325; 364/270; 364/232.9; 364/221.7; 364/569; 364/232.7; 364/DIG. 1
[58] Field of Search ... 364/200 MS File, 900 MS File, 364/569

[56] References Cited

U.S. PATENT DOCUMENTS

| | | | |
|---|---|---|---|
| 4,161,787 | 7/1979 | Groves | 364/900 |
| 4,168,525 | 9/1979 | Russell | 364/559 |
| 4,255,790 | 3/1981 | Hondeghem | 364/487 |
| 4,513,387 | 4/1985 | Neyer | 364/718 |
| 4,705,970 | 11/1987 | Turnpaugh | 371/62 |
| 4,930,100 | 5/1990 | Morinaga et al. | 364/900 |
| 4,939,755 | 7/1990 | Akita et al. | 364/200 |

OTHER PUBLICATIONS

Roger E. Shivas, "Virtual Instrumentation", Automatic Testing '79 Session 2.
Doreen Keenan, "Incorporation of Programmable Logic in Second Generation Virtual Instruments", Proceedings—Autotestcon '87:IEEE International Automatic Testing Conference, San Francisco, Calif., Nov. 3-5, 1987.

*Primary Examiner*—Lawrence E. Anderson
*Attorney, Agent, or Firm*—Scully, Scott, Murphy & Presser

[57] ABSTRACT

A reconfigurable signal processing device that includes a plurality of programmable modules that are reconfigurable to perform one of a plurality of selected signal processing functions. The modules may be reconfigured under software control to act as one of a time base generator, a counter, an accumulator, an address register, a delay circuit, and a timer. The plurality of modules are selectively reconfigured and selectably interconnected by a configuration and control circuit that receives command signals from the host processor containing the control software. The device further includes a plurality of input channels for receiving and initially processing analog signals to be tested and a high speed memory for storing data as required for the selected signal processing device. The devices that can be formed by configuring and interconnecting the programmable modules are for example, a counter/timer, an arbitrary function generator, a pluse generator, and a digitizer.

19 Claims, 19 Drawing Sheets

SOFTWARE RECONFIGURABLE INSTRUMENT WITH PROGRAMMABLE COUNTER MODULES RECONFIGURABLE AS A COUNTER/TIMER, FUNCTION GENERATOR AND DIGITIZER

CROSS-REFERENCE TO RELATED APPLICATIONS

The present application is a continuation-in-part application of U.S. Ser. No. 860,158 filed on May 6, 1986, entitled "Universal Programmable Counter/Timer and Address Register Module" and now abandoned.

BACKGROUND OF THE INVENTION

1. Field of the Invention

The present invention relates to programmable gate arrays and more particularly, to the use of software reconfigurable gate arrays to provide various measurement and stimulus functions for Automatic Test Equipment (ATE) systems.

2. Discussion of the Prior Art

Automatic test equipment (ATE) systems require various test instruments such as, a counter/timer, an arbitrary function generator and a digitizer, to provide the necessary measurement and stimulus functions for the test specifications of the units under test. In conventional ATE systems, each of the functions are provided in the form of stand alone test instruments which provide each individual function. The stand alone test equipment elements are tied together through a common bus but are housed in separate compartments. The system software for controlling the instruments is highly dedicated and modular. A central processor controls and communicates with each of the instruments through a central bus, typically an IEEE-488 bus. For each instrument, a corresponding software module exists to control its operation during test procedures. Examples of stand alone programmable test instruments that can be utilized in an ATE system may be found in U.S. Pat. No. 4,168,525 directed to a universal timer with selectable time base and clock output, U.S. Pat. No. 4,513,387 directed to a digital arbitrary function generator and U.S. Pat. No. 4,255,790 directed to a programmable pulse generating system.

These conventional test instruments require extensive logic circuits to perform the complex functions required for the instrument to operate and to be properly interfaced with the central processor. The design and hardware costs are high for each specialized circuit and a great deal of circuit board area is required, further increasing costs. Power consumption tends to be high, thereby generating excessive heat levels. Reliability is often not as high as would be desirable and trouble shooting is difficult and time consuming. In addition, redundant hardware is a problem as duplication wastes system space and generally causes a reduction in ATE system reliability and throughput as well as increasing maintenance costs.

In an alternative approach, suggested by Shivas in Automatic Testing 1979, functions common to each of the ATE test instruments would be provided in the form of modules that would be combined together under control of software to form the desired instrument. The Shivas proposal, called the "virtual instrument" contemplates a reconfigurable ATE system by interconnecting the basic building block modules required to perform the desired test functions. However, there is no disclosure of an actual implementation of the virtual instrument concept nor the necessary control interface between the processor containing the software and the instrument modules.

SUMMARY OF THE INVENTION

The present invention is directed to an instrument that can be programmed and reconfigured in real time from a host processor as any of a family of common stimulus and measurement instruments. The present invention provides a reconfigurable signal processing device that includes a plurality of programmable modules that are reconfigurable to perform one of a plurality of selected signal processing functions. The modules may be reconfigured under software control to act as one of a time base generator, a counter, an accumulator, an address register, a delay circuit, and a timer. The plurality of modules are selectively reconfigured and selectively interconnected by a configuration and control circuit that receives command signals from the host processor containing the control software. The device further includes a plurality of input channels for receiving and initially processing analog signals to be tested and a high speed memory for storing data as required for the selected signal processing device. The devices that can be formed by configuring and interconnecting the programmable modules are for example, a counter/timer, an arbitrary function generator, a pulse generator, and a digitizer.

The modules are implemented in software programmable gate arrays. In one embodiment of the invention, the modules are divided into three programmable counter groups to provide the shared counter functions. The counting groups are designated delay, burst and main groups which require two, one and three counters, respectively. Each group forms a special function depending on the mode of operation selected. The instrument is basically divided into an analog section and a digital section. The analog section of the instrument is used for conditioning of the input signals and to provide an interface to the digital section. The digital section can be divided into three sections; configuration and control circuitry, timing/counting module circuitry and memory management circuitry.

Inputs enter the instrument through the analog section and interface the programmable system configuration and control digital logic circuitry. The output from the digital circuitry is derived from the system reference clock and the trigger signals from any or all three analog input channels. The controls to the three counter groups are determined by the programmed mode. In essence, the manner in which the counter group is configured into the instrument's architecture and the functionality it provides is determined by this circuit. The configuration and control circuit is also implemented in a software programmable gate array and has all the circuitry necessary to select and interconnect the resource elements to form the selected test device.

The programmable binary counter groups are used in the instrument to provide shared counter chains. The counters can be cascaded to create two groups of counters, a 32 bit and a 16 bit pair or a single 48 bit counter. The counters were designed into 2400 gate equivalent gate arrays with mixed emitter coupled logic (ECL) and transistor, transistor logic (TTL) input/output cells similar to the control circuit gate array.

The memory management section primarily consists of a high speed memory and two data flow management gate arrays. The gate arrays are responsible for the transition of data to and from the device to the host microprocessor's memory. In addition, the gate arrays are responsible for selecting analog to digital and digital to analog converters. The two data flow management gate arrays are designed on 2400 gate ECL gate arrays.

In one mode of operation, the software reconfigurable instrument is configured as a counter/timer. In the counter/timer mode of operation, the instrument is used for frequency and time interval measurements, ratio measurements and measurements requiring a combination of time interval measurements such as duty cycle and phase shift measurements. In a second mode of operation the software reconfigurable instrument is configured as an arbitrary function generator to output various waveforms such as sine, cosine, triangle, sawtooth or any more complex arbitrary functions. In a third mode of operation, the software reconfigurable instrument is configured as a digitizer to digitize input waveforms.

The software reconfigurable instrument of the present invention shares common resources that form the building blocks of each instrument and reconfigures them in real-time under software control. The reconfigurability minimizes total system hardware requirements by providing a plurality of instrument functions on a single board instrument. The present invention reduces total system complexity by eliminating the need for a multiplicity of dedicated instruments or devices. The software reconfigurable instrument of the invention duplicates the function of many stand alone instruments while minimizing redundant hardware, resulting in smaller space requirements.

BRIEF DESCRIPTION OF THE DRAWINGS

For the purpose of illustrating the invention, there is shown in the drawings the forms which are presently preferred; however, it should be understood that the invention is not necessarily limited to the precise arrangements and instrumentalities here shown.

DESCRIPTION OF THE PREFERRED EMBODIMENT

The software reconfigurable instrument of the present invention replaces traditional measurement and stimulus instruments such as counter/timers, waveform digitizers and analog function and pulse generators by sharing common resources that form the building blocks of each instrument and reconfiguring them in real-time under software control.

Figure 1A:
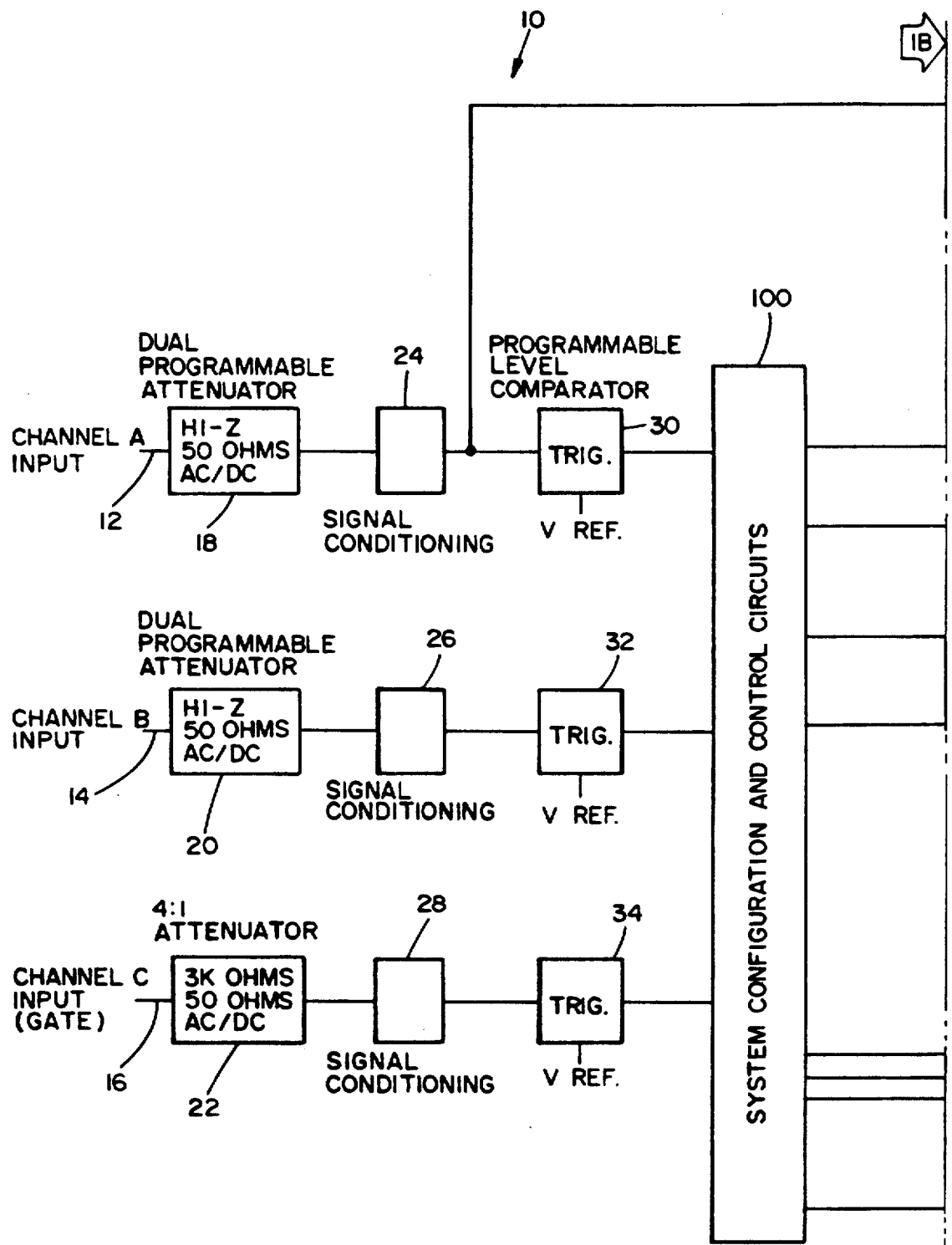
FIG. 1 is a block diagram of the software reconfigurable instrument system of the present invention.
Figure 1B:
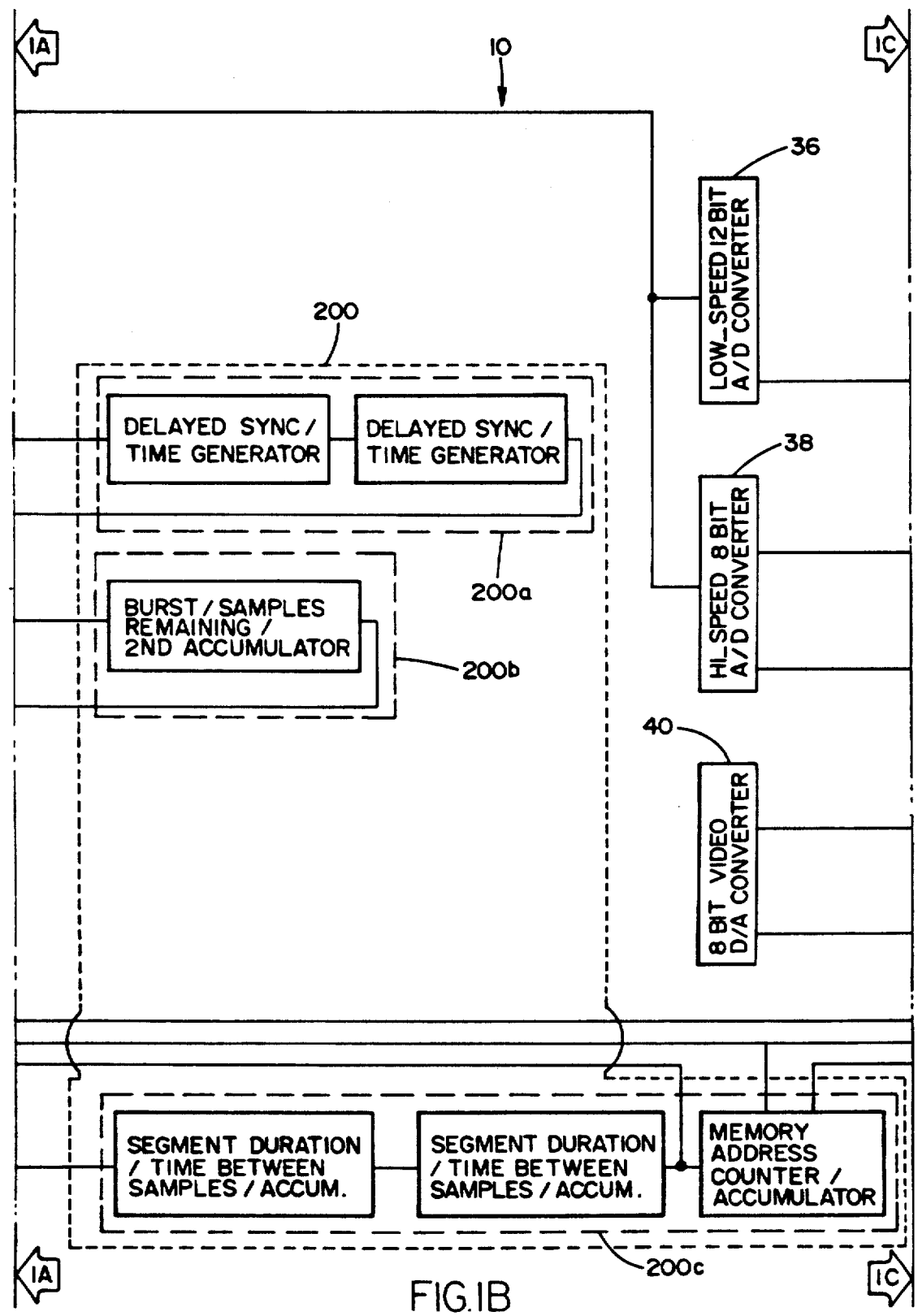
Figure 1C:
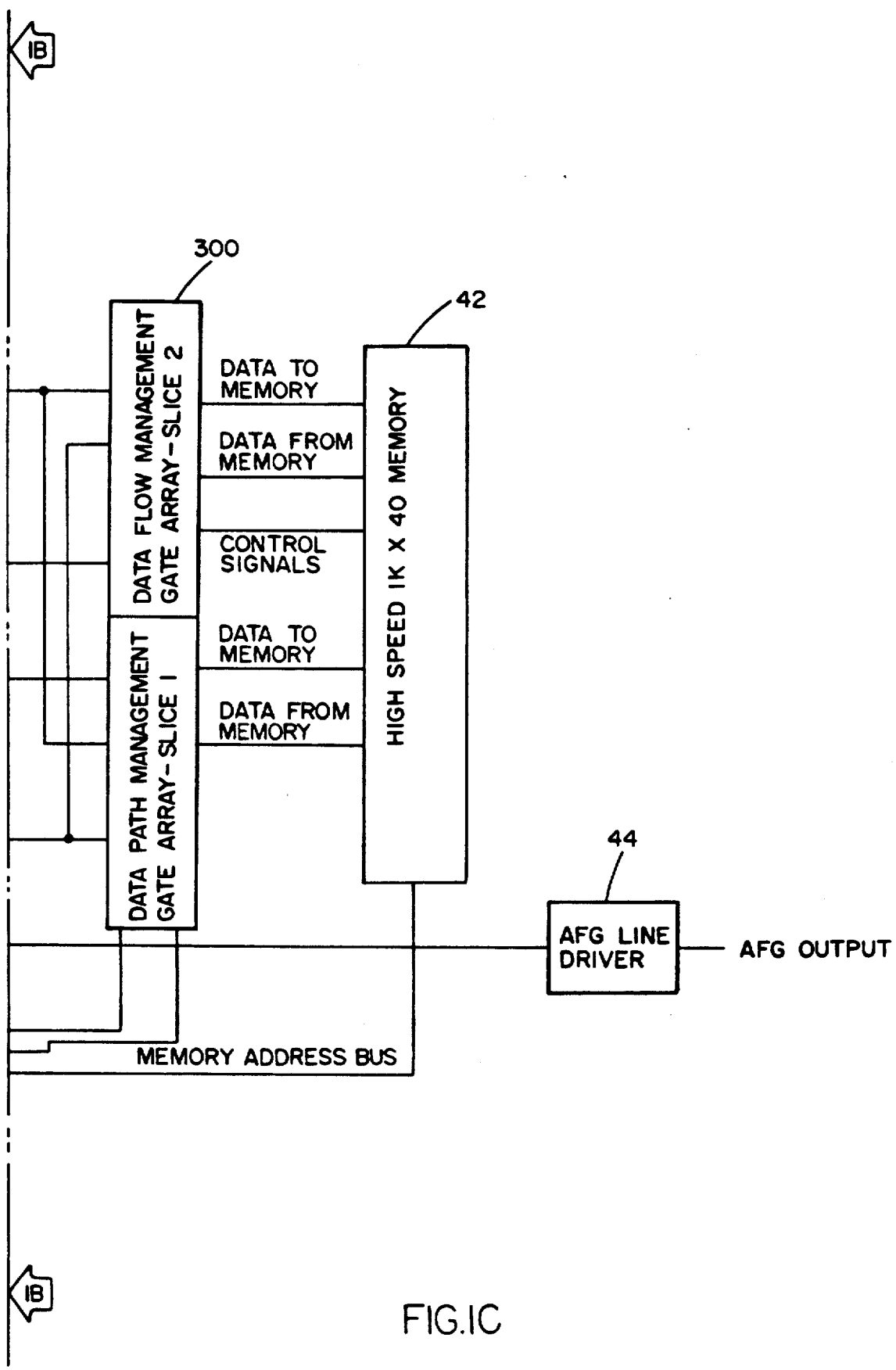

Referring now to FIG. 1, there is shown a block diagram illustrating the software reconfigurable instrument 10 architecture. The software reconfigurable instrument 10 is divided into two main sections, an analog section and a digital section. Inputs from the outside world are brought into the instrument 10 and are processed in the analog section before entering the digital section. The analog signal processing is necessary to ensure that the signals entering the instrument 10 are compatible with the particular family of digital logic used in the digital section of the instrument 10.

There are three input channels 12, 14, and 16 which shall be designated as channel A, channel B, and channel C respectively. Any signals entering the instrument 10 from the outside world enter the instrument 10 through all three channels or any combination thereof. For the purposes of this specification, the term outside world shall mean anything other than the host microprocessor (not shown) or the instrument 10. Input channels 12 and 14 have dual programmable attenuator circuits 18 and 20 which have ac/dc coupling and programmable impedance levels. The dual programmable attenuators 18 and 20 are comprised of a series of resistive voltage dividers cascaded together through a series of relays. By opening and/or closing a particular relay, variable attenuation can be achieved, thus the term programmable attenuator. In addition, the dual programmable attenuators 18 and 20 have a high impedance path and a low impedance path, which can be selectively activated depending on the type of signal entering from the outside world, as well as ac/dc coupling capabilities. Input channel 16 has a fixed attenuation circuit 22 that has ac/dc coupling and a programmable impedance source. Channel 16 operates in an identical manner as channels 12 and 14 with the exception that the attenuation factor range is more limited.

The next stage of the analog section of the instrument 10 is the signal conditioning circuitry section. The outputs from dual programmable attenuators 18 and 20 and fixed attenuator 22 are inputs to signal conditioning circuits 24, 26, and 28 respectively. Each signal conditioning circuit 24, 26, and 28 is identical in design and function, and each is capable of filtering functions, scaling functions and adding gains and offsets to their respective input signals. The output of signal conditioning circuitry 24 can be routed to the digital section of the instrument 10 through either of two analog to digital converters 36 or 38 if so required for the particular instrument 10 application or continue through to the third and final stage of analog signal processing.

The third stage of analog signal processing involves passing the incoming signals through programmable level comparator circuits. The outputs from signal conditioning circuits 24, 26, and 28 are routed to programmable level comparators 30, 32, and 34 respectively. The programmable level comparator circuits 30, 32, and 34 are comparator circuits in which the reference signals can be changed or programmed to achieve certain desired output characteristics for the comparator. In addition, the programmable level comparators 30, 32, and 34 are capable of having hysteresis programmed or introduced into their circuitry in order to achieve certain operating conditions for the comparators 30, 32, and 34. The use of comparator circuits 30, 32, and 34 is dictated by the particular mode of operation of the instrument 10; however, the basic function of comparator circuits 30, 32, and 34 is to detect certain levels of incoming signals. The outputs of the comparators 30, 32, and 34 are directed to the first section of digital circuitry of the instrument 10. It is important to note that the circuitry involved in all stages of the analog section of the instrument 10 are common circuit elements configured in standard ways and are all well known in the art of analog design.

The digital section of the instrument 10 is comprised of three main sections of digital circuitry, each of which performs a specific function. The first section of digital logic is a system configuration and control circuits gate array 100 and it receives data from the outside word via programmable comparators 30, 32, and 34, and it receives commands and transmits data to a host microprocessor or host computer (not shown) via a bidirectional data bus (not shown). The system configuration and control circuits gate array 100 is responsible for controlling and configuring the remaining two sections of digital circuitry for various system tasks.

The second section of digital logic is a counter/timer gate array 200 which is actually two separate, but identical gate arrays. The counter/timer gate array 200 is controlled and configured by the system configuration and control circuits gate array 100 and is capable of two way communication with the host microprocessor or computer (not shown) via the bidirectional data bus (not shown). The counter/timer gate array 200 is subdivided into three counter groups each of which can be configured to provide a plurality of counting and timing functions. The three groups are a delay counter group 200a, a burst counter group 200b, and a main counter group 200c.

The third section of digital logic is a data flow management gate array 300. The data flow management gate array 300 is responsible for the flow of data to and from the instrument 10 to the host microprocessor (not shown) and to the outside world. The data flow management gate array 300 is capable of two way communication with the host microprocessor via the bidirectional data bus (not shown). The data flow management gate array interfaces with a low speed 12-bit analog to digital converter (A/D) 36, a high speed 8-bit A/D 38, an 8-bit video digital to analog converter (D/A) 40, and a high speed external memory array 42. The 8-bit D/A 40 transmits converted data to the outside world through an arbitrary function generator line driver 44. The line driver 44 comprises analog circuitry which provides filtering functions, and programmable gain and offset functions for signals exiting the instrument 10. The two A/D's 36 and 38 receive analog data from the outside world via signal conditioning circuitry 24.

The aforementioned gate arrays 100, 200 and 300 are typically manufactured using bipolar technology. The bipolar arrays provide high speed, high density ECL logic and mixed-mode input/output capabilities in a small component package that can meet high speed system clock rates, and interface with both the transistor-transistor logic (TTL) microprocessor and ECL instrument interfaces. They serve as a cost effective replacement for the discrete ECL components because they require considerably less power and are much more reliable. Each gate array directly communicates with the off-board TTL microprocessor as well as with the ECL instrument interface. The function and operation of each of the aforementioned gate arrays shall be explained in more detail in subsequent paragraphs.

The system configuration and control circuits gate array 100 is responsible for configuring and controlling the three counter groups 200a, 200b, and 200c for each mode of operation of the instrument 10. The system configuration and control circuits gate array 100 is responsible for generating arm, run, and stop conditions for the three counter groups 200a, 200b, and 200c based on programmed slope and channel selection, and also provides the instrument 10 with the means for autoranging on the amplitude of the input signals. In addition, the system configuration and control circuits gate array 100 is a data link back to the host microprocessor (not shown).

Figure 2A:
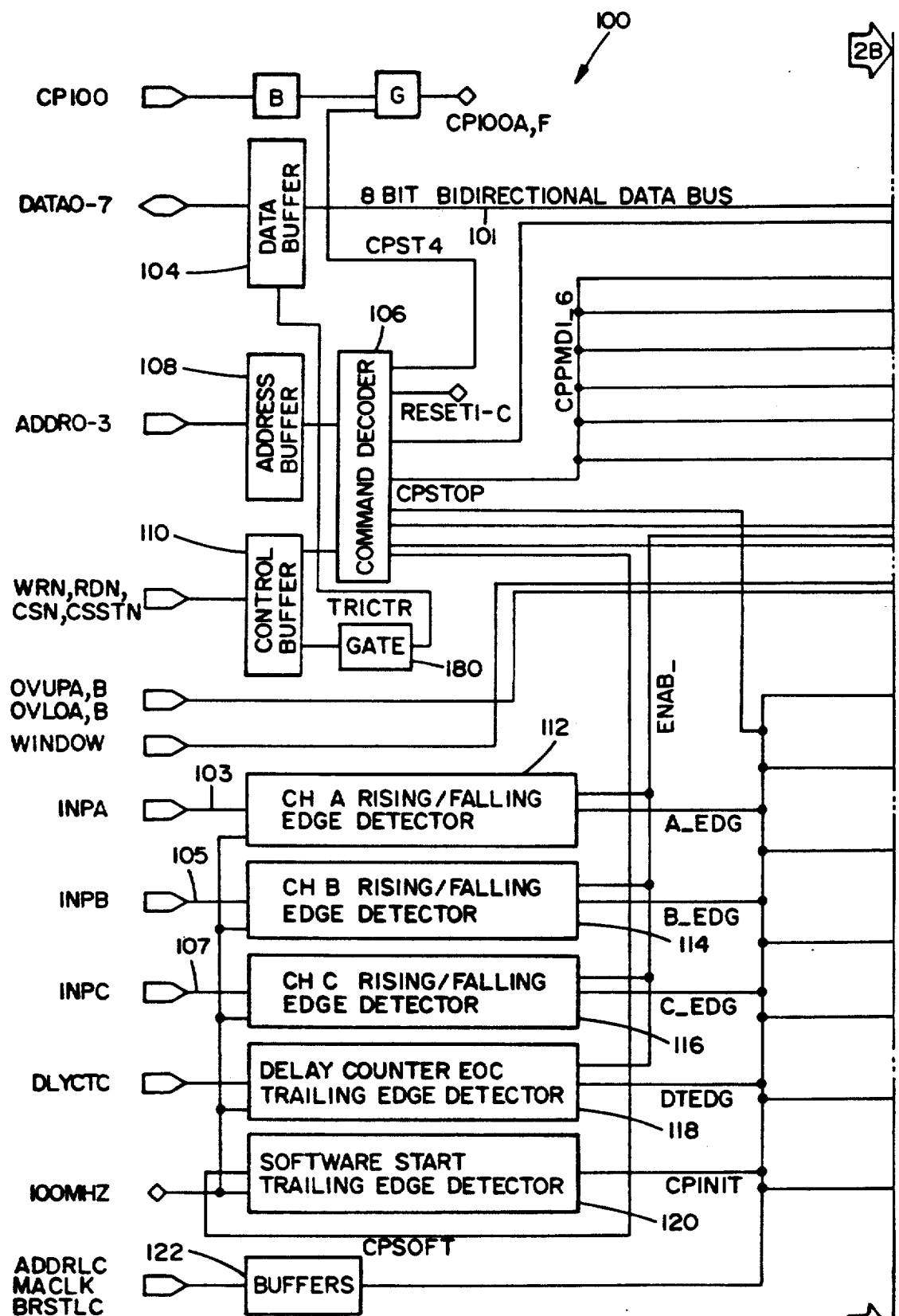
FIG. 2 is a block diagram of the system configuration and control circuit gate array.
Figure 2B:
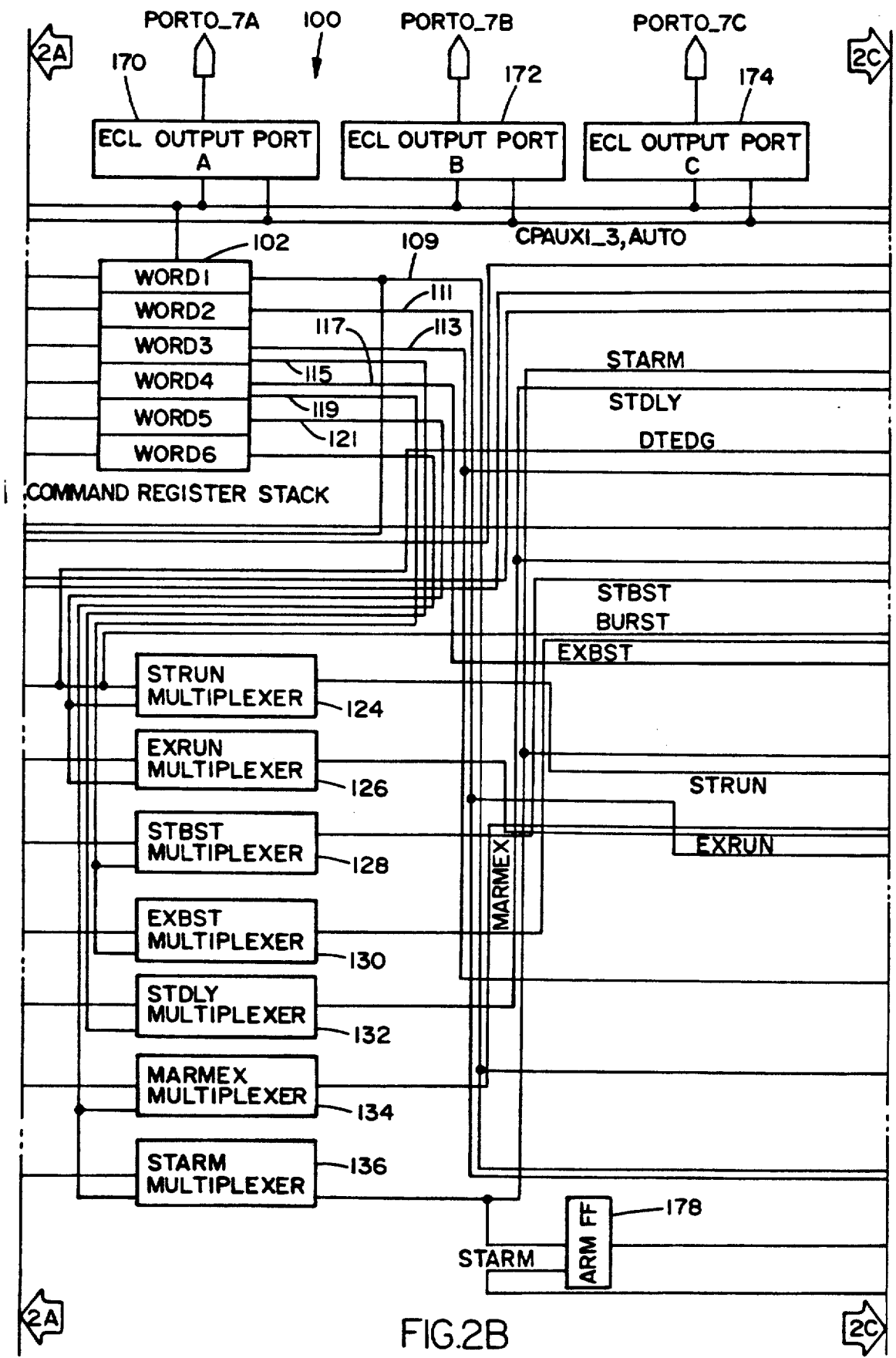
Figure 2C:
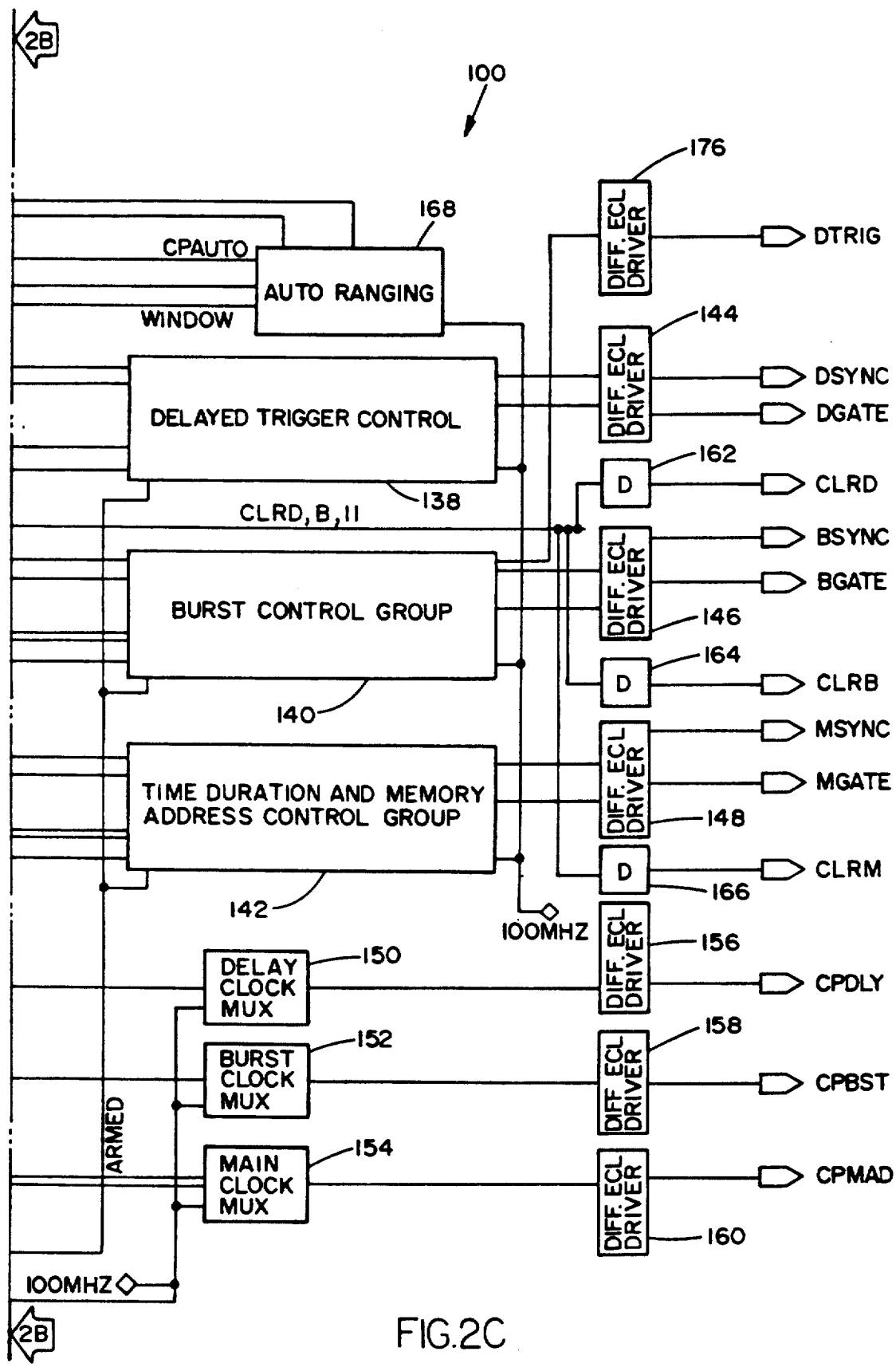

Referring now to FIG. 2, a block diagram of the system configuration and control circuits gate array 100 is shown. The host microprocessor (not shown) has access to a 6-byte command register stack 102 via a byte wide bidirectional data bus 101. The data entering or exiting the system configuration and control circuits gate array 100 via the bidirectional data bus is buffered by a tri-state, byte-wide bidirectional port 104. The command register stack 102 maintains the current status of the instrument 10, and transmits and receives data from the host microprocessor via data bus 101.

The data loaded into the command stack 102 is decoded and processed by a command decoder 106. Each of the commands stored in command stack 102 will be discussed in subsequent paragraphs. The command decoder 106 receives four address lines, ADDR0-3, and a chip select signal, CSN, via two additional tri-state byte-wide bidirectional ports 108 and 110 respectively, and are decoded with an externally generated write pulse, WRN, generating a plurality of control strobes. A second chip select, CSSTN, enters through port 110, and is used for generating self test strobes and reset pulses to the counter groups 200a, 200b, and 200c. A read command, RDN, from control buffer 110, enters a gate 180 via control buffer 110. The gate 180 provides a buffer read command signal, TRICTR, to data buffer 104.

Inputs from channel A, channel B, and channel C, as shown in FIG. 1, enter the system configuration and control circuits gate array 100 through input signal lines 103, 105, and 107 respectively. The inputs are fed into a channel A rising/falling edge detector 112, a channel B rising/falling edge detector 114, and a channel C rising-/falling edge detector 116. A delay counter end of count signal, DLYCTC, enters a delay counter end of count trailing edge detector 118 and a 100 MHz clock signal, 100 MHz, enters a software start trailing edge detector 120. The delay counter end of count signal is provided by the counter/timer gate array 200 shown in FIG. 1. The edge detectors 112, 114, 116, 118, and 120 provide strobe signals A_EDG, B_EDG, C_EDG, DTEDG and CPINIT respectively, that along with the information contained in command stack 102 and a memory address count signal, MACLK, a burst end of count signal, BRSTLC, and an address counter last count signal, ADDRLC, buffered by buffer circuits 122 are provided as control and selection signals to a set of seven multiplexer circuits 124, 126, 128, 130, 132, 134 and 136. The seven multiplexers 124, 126, 128, 130, 132, 134 and 136 receive information from command stack 102 via signal lines 109, 111, 113, 115, 117, 119 and 121, and a clock pulse stop signal, CPSTOP, from command decoder 106. The outputs of the seven multiplexers 124, 126, 128, 130, 132, 134 and 136 generate the appropriate synchronization pulses, gates and clocks required for the class of instrumentation being programmed. Main group start, STRUN, main group stop, EXRUN, burst group start, STBST, burst group stop, EXBST, delay group start, STDLY, arm all groups, STARM, and arm main group stop, MARMEX, provided by multiplexers 124, 126, 128, 130, 132 134, and 136 respectively, are the seven conditions that generate the aforementioned appropriate responses.

The output signals from the multiplexers 124, 126, 128, 130, 132, 134, and 136 are used as inputs into a delay group controller 138, a burst group controller 140, and a main group controller 142. The controllers 138, 140 and 142 receive four basic inputs, arm start, start, stop and arm stop, which are fully named in the previous paragraph, and generate two basic outputs, a synchronization or preset strobe to a particular counter group and an enable count gate to a particular counter group. An arm condition is generated via an arm flip-flop 178, which receives a start arm signal, STARM, from multiplexer 136 and a clock signal, 100 MHz, and outputs and arm signal, ARMED, to controllers 138, 140 and 142. Each counter group is controlled in a similar manner depending upon the mode of operation of the instrument 10 shown in FIG. 1, as dictated by the host microprocessor. The output signals from each of the controllers 138, 140, and 142 are routed through differential ECL drivers 144, 146 and 148 before entering the counter groups in order to ensure that the signals are at the proper levels for further processing. The outputs of differential ECL driver 144 are the synchronization strobe, DSYNC, and the enable count gate, DGATE, respectively, and are routed to the delay counter group 200a shown in FIG. 1. The outputs of differential ECL driver 146 are the synchronization strobe, BSYNC, and the enable count gate, BGATE, respectively, and are routed to the burst counter group shown in FIG. 1. The outputs of differential ECL driver 148 are the synchronization strobe, MSYNC, and the enable count gate, MGATE, respectively, and are routed to the main counter group 200c shown in FIG. 1. In addition, a differential ECL driver 176 which receives signals from the burst control group 140 outputs a digitizer trigger signal, DTRIG, to the data flow management gate array 300 shown in FIG. 1.

A delay clock multiplexer 150, a burst clock multiplexer 152, and a main clock multiplexer 154 receive inputs from command stack 102 as well as a 100 MHz clock signal, 100 MHz, and provide clock strobes or pulses to the three counter groups 200a, 200b and 200c shown in FIG. 1. The output signals from the clock multiplexers 150, 152, and 154 are routed through differential ECL drivers 156, 158 and 160 respectively so as to ensure that the signals are at the proper levels for further processing. The output of differential ECL driver 156 is a clock pulse signal, CPDLY, for the delay counter group 200a shown in FIG. 1. The output of differential ECL driver 158 is a clock pulse signal, CPBST, for the burst counter group 200b shown in FIG. 1. The output of differential ECL driver 160 is a clock pulse signal, CPMAD, for the main counter group 200c shown in FIG. 1.

The command decoder 106 also provides a reset external delay counter group signal, CLRD, via a D-type flip-flop 162 to the delay counter group 200a shown in FIG. 1, a reset external burst counter group signal, CLRB, via a D-type flip-flop 164 to the burst counter group 200b shown in FIG. 1, and a reset external main counter group signal, CLRM, via a D-type flip-flop 166 to the main counter group 200c as shown in FIG. 1.

Figure 5A:
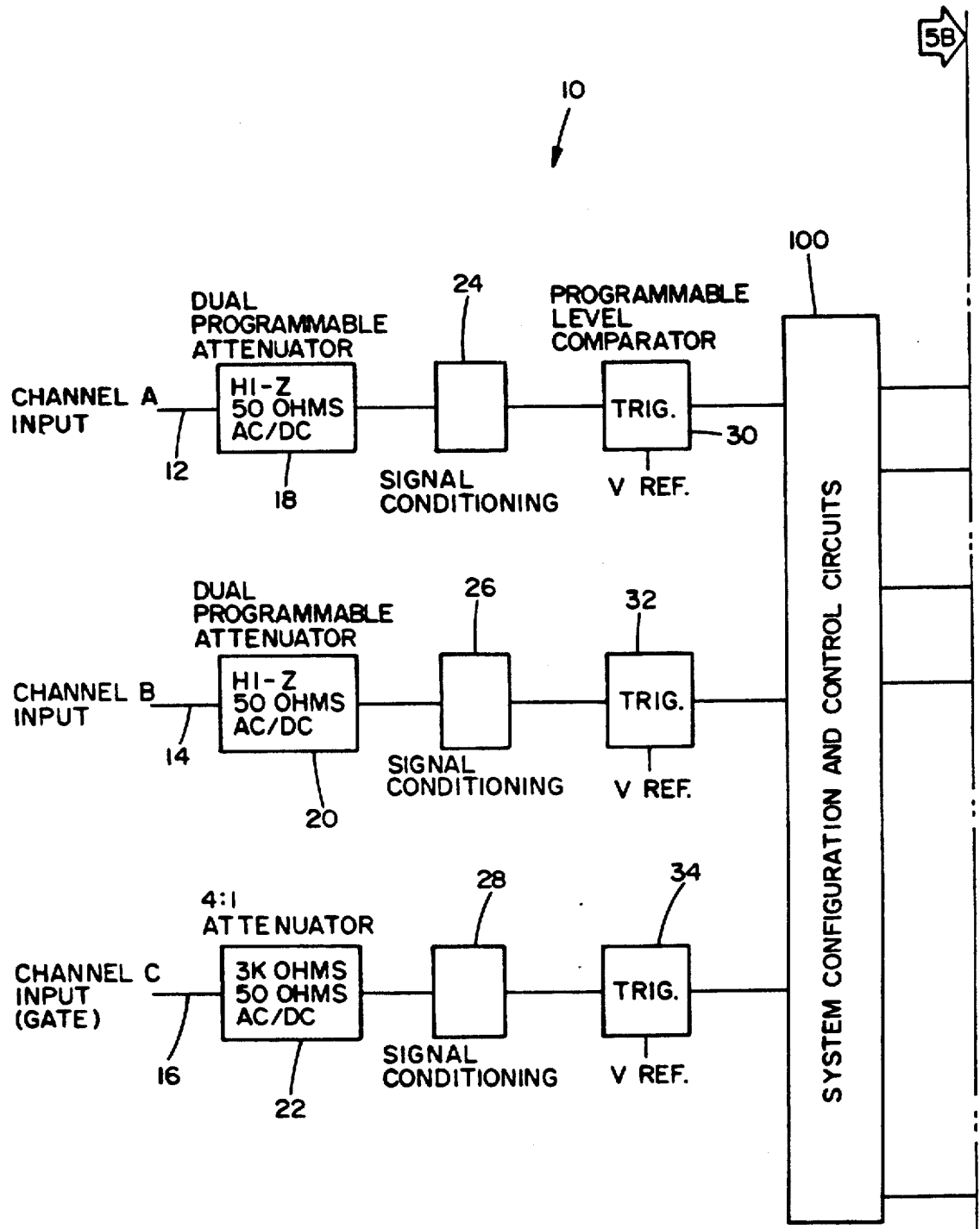
FIG. 5 is a block diagram of the software reconfigurable instrument system configured as a counter/timer.
Figure 5B:
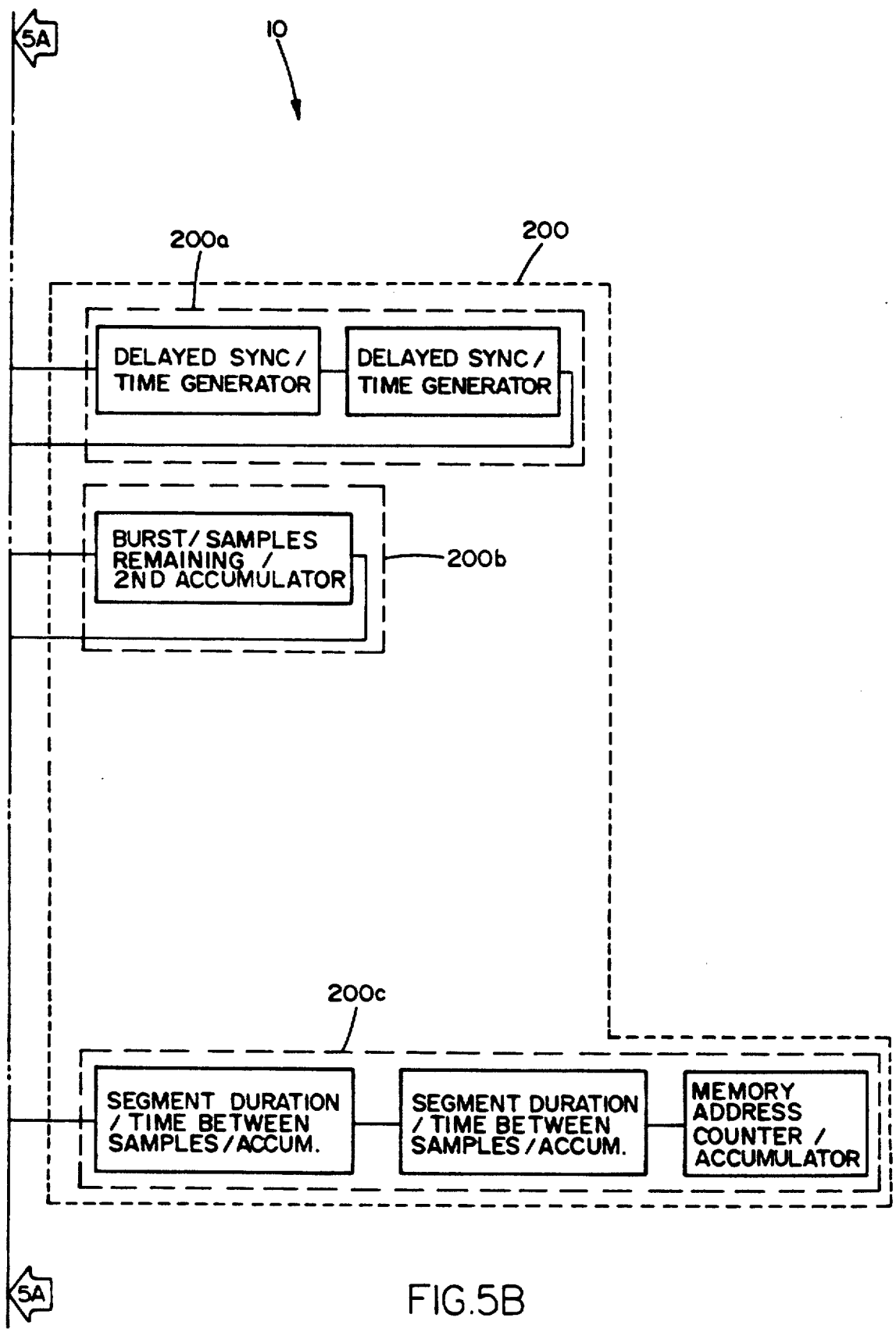
Figure 6A:
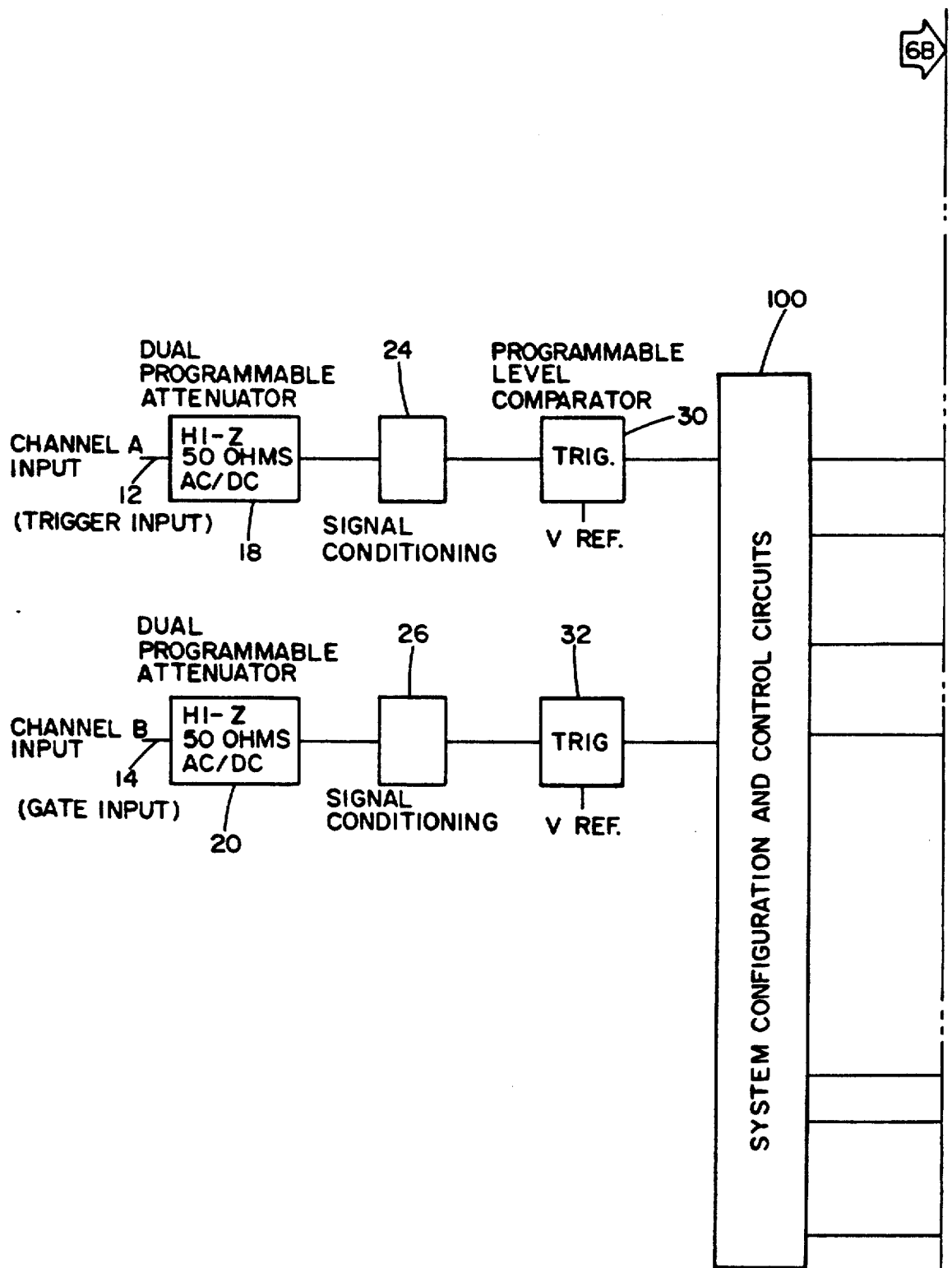
FIG. 6 is a block diagram of the software reconfigurable instrument system configured as an arbitrary function generator.
Figure 6B:
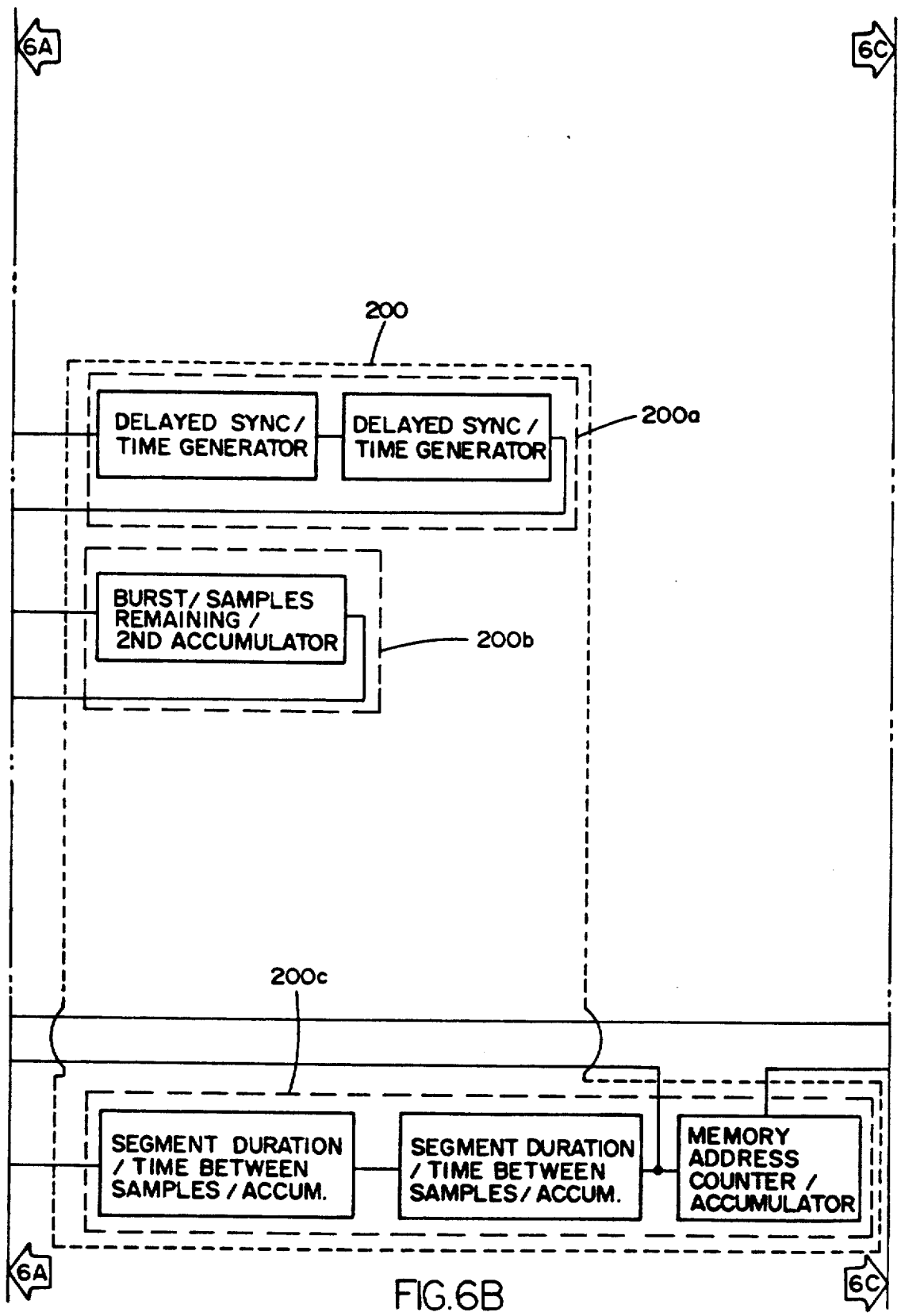
Figure 6C:
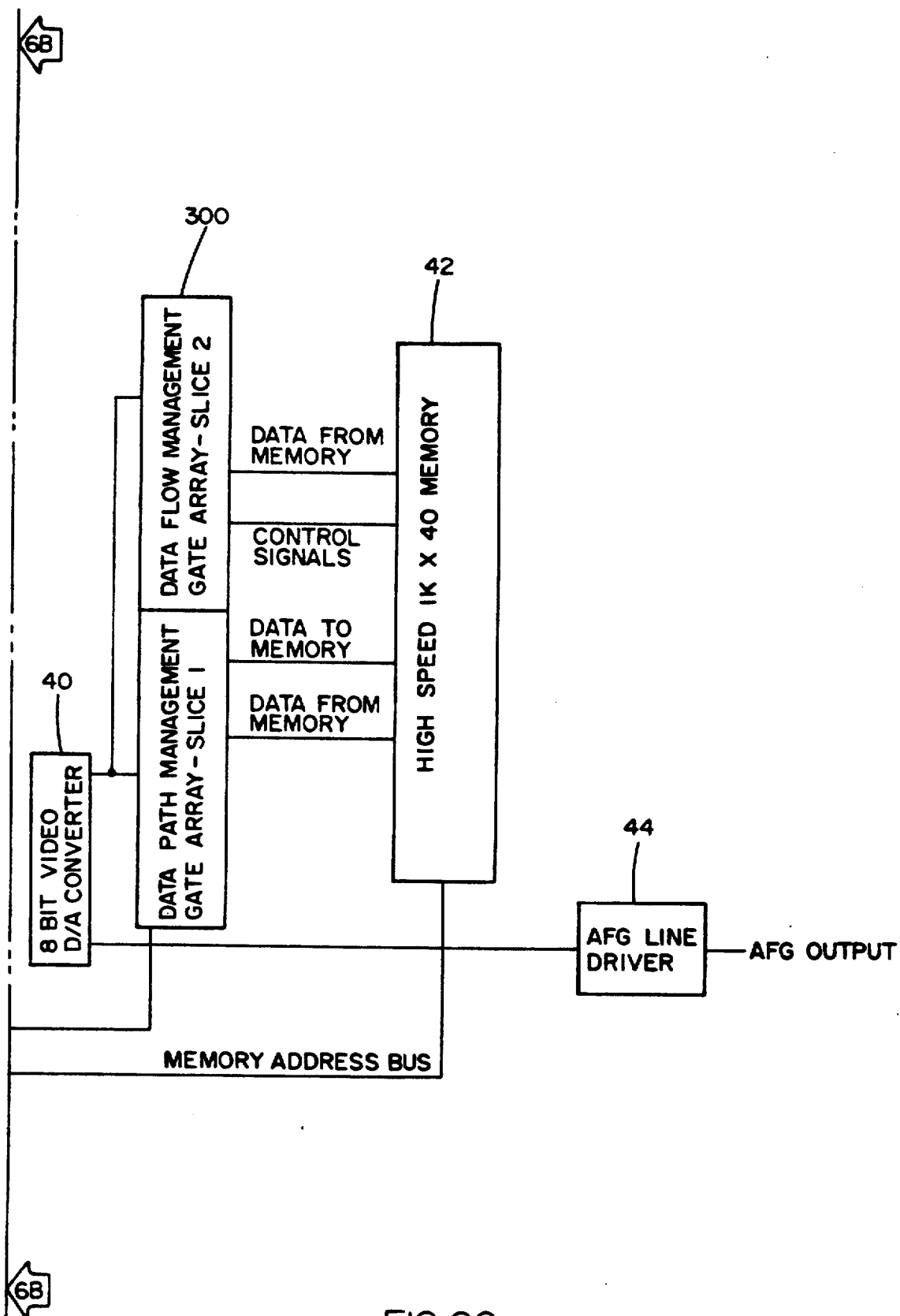
Figure 7A:
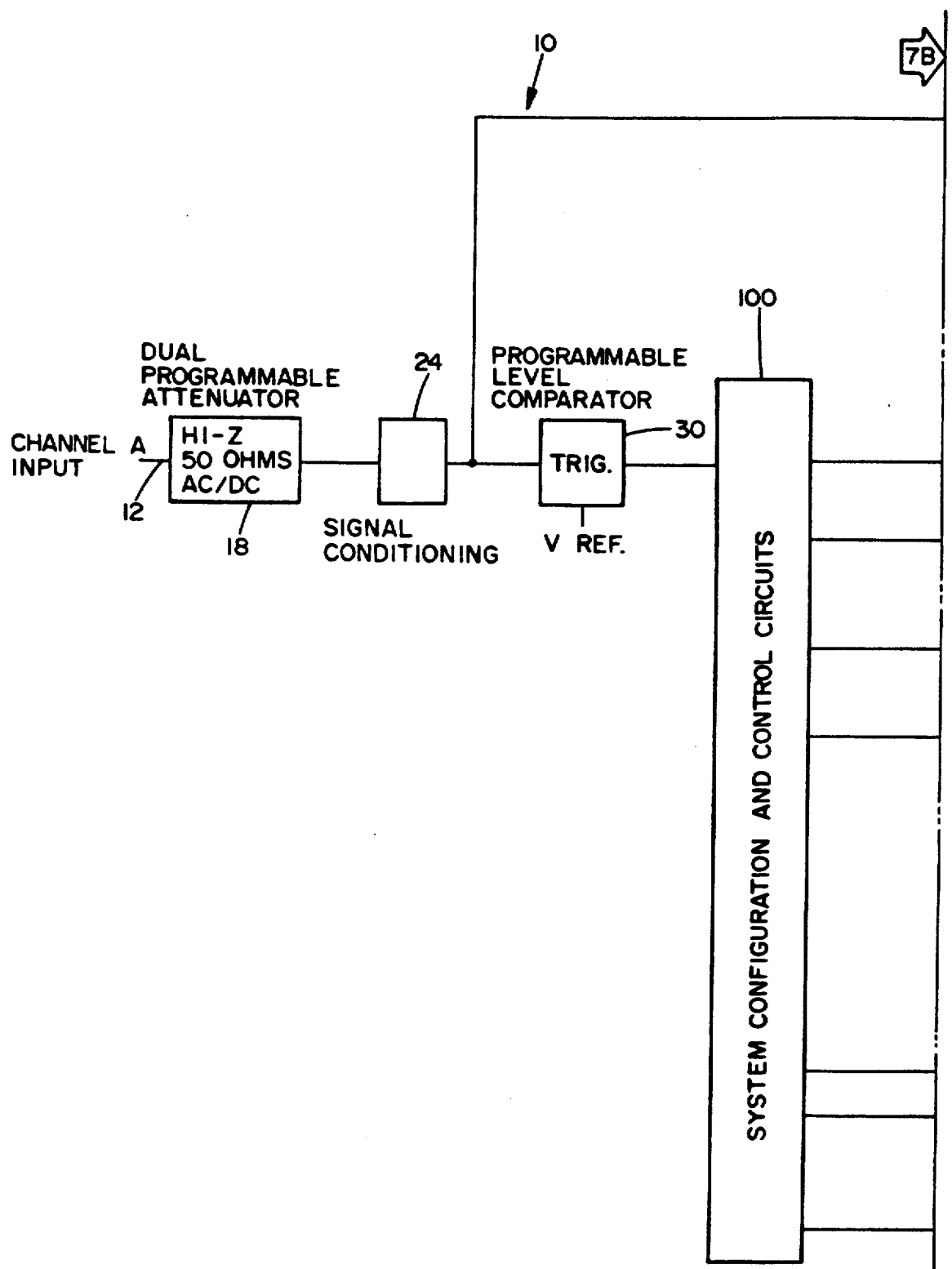
FIG. 7 is a block diagram of the software reconfigurable instrument system configured as a digitizer.
Figure 7B:
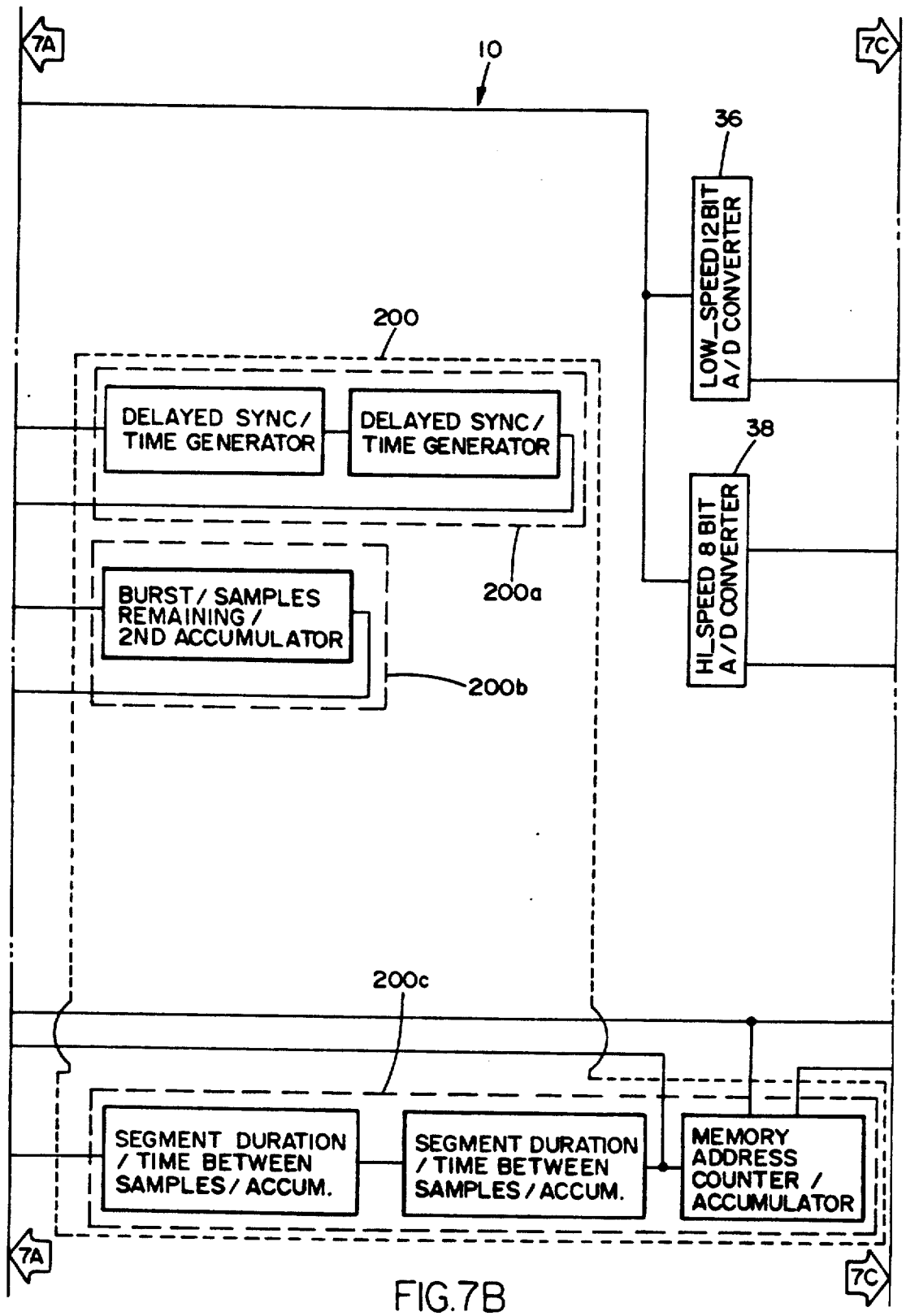
Figure 7C:
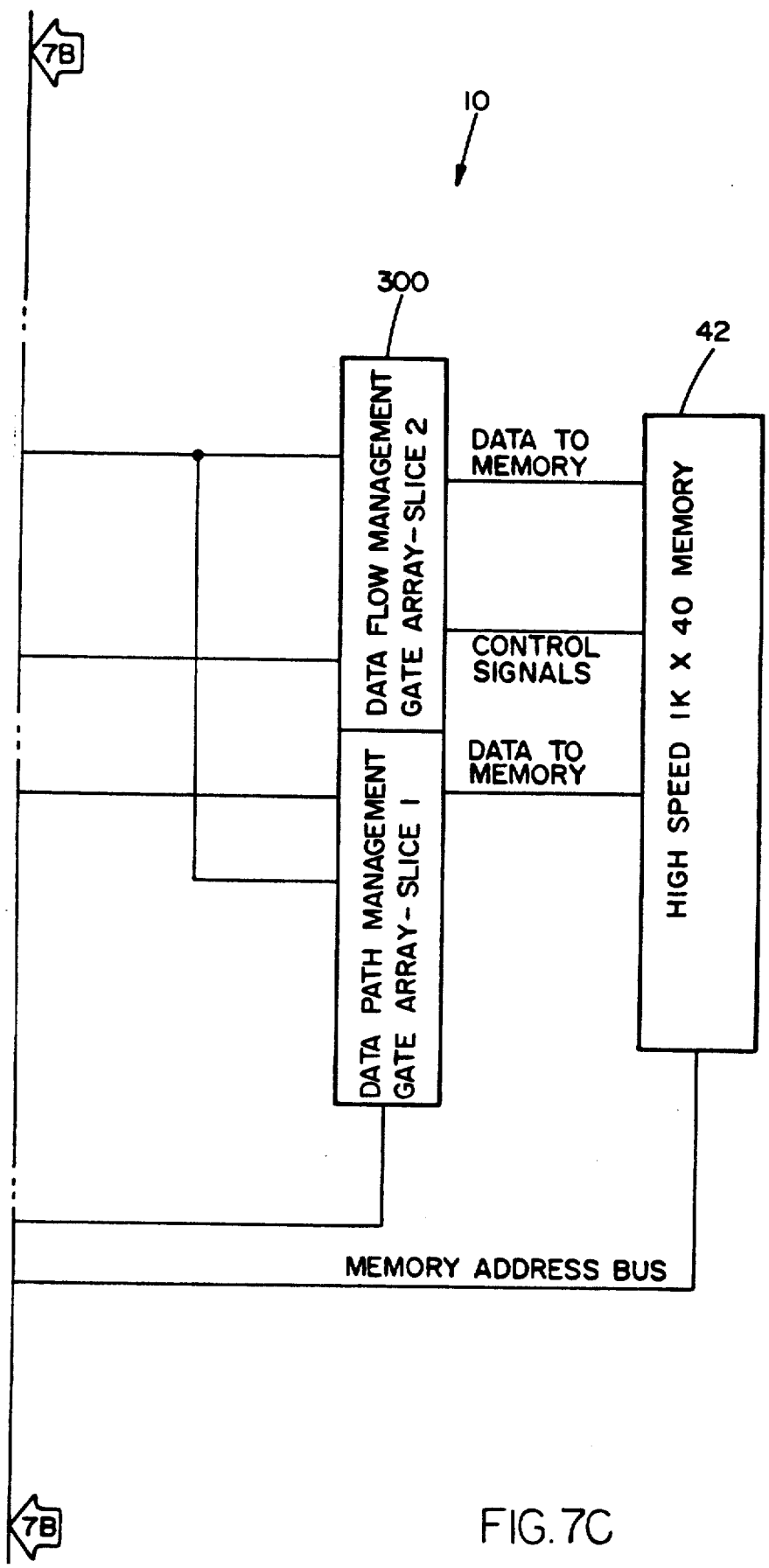

The system configuration and control circuits gate array 100 provides autoranging circuitry 168 which receives overvoltage status signals, OVUPAB, and OVLOAB, from input channels A and B and a clock pulse signal, CPAUTO, from command decoder 106 and a window signal. The window signal, WINDOW, sets the autoranging cycle for proper operation. Autoranging circuitry 168 provides autoranging capability for the instrument 10. The system configuration and control circuits gate array 100 also provides three byte wide output programmable ports 170, 172, and 174 which provide the instrument 10 with ECL discretes to efficiently utilize input/output cell availability. The aforementioned functions and capabilities of the system configuration and control circuits gate array 100 are more fully explained in subsequent paragraphs that deal with the overall operation of the instrument 10 in different modes of operation as shown in FIGS. 5-7.

The counter/timer section of the instrument 10 is realized in two identical gate arrays. One gate array contains what is shown in FIG. 1 as the delay counter group 200a and the burst counter group 200b. The second gate array contains what is shown in FIG. 1 as the main counter group 200c. Each counter gate array contains three 16-bit binary counters configurable in any one of three different schemes by uniquely defining one 16-bit command word.

The purpose of the counter/timer gate arrays is to provide the instrument 10 with various counting and timing functions. In one implementation, one single gate array may be programmed to provide two separate counter chains of 32-bits, which is the delay counter group 200a shown in FIG. 1, and 16-bits, which is the burst counter group 200b shown in FIG. 1. In a second implementation, the 16-bit counter, and the 32-bit counter are cascaded to form one 48-bit counter. The second gate array, has the 32-bit counter and the 16-bit counter cascaded together to form one 48-bit counter, which is the main counter group 200c shown in FIG. 1. The use of each of the counter groups 200a, 200b and 200c are fully explained for each mode and implementation of the counter/timer gate array's in relation to that of the functions of the instrument 10.

Figure 3A:
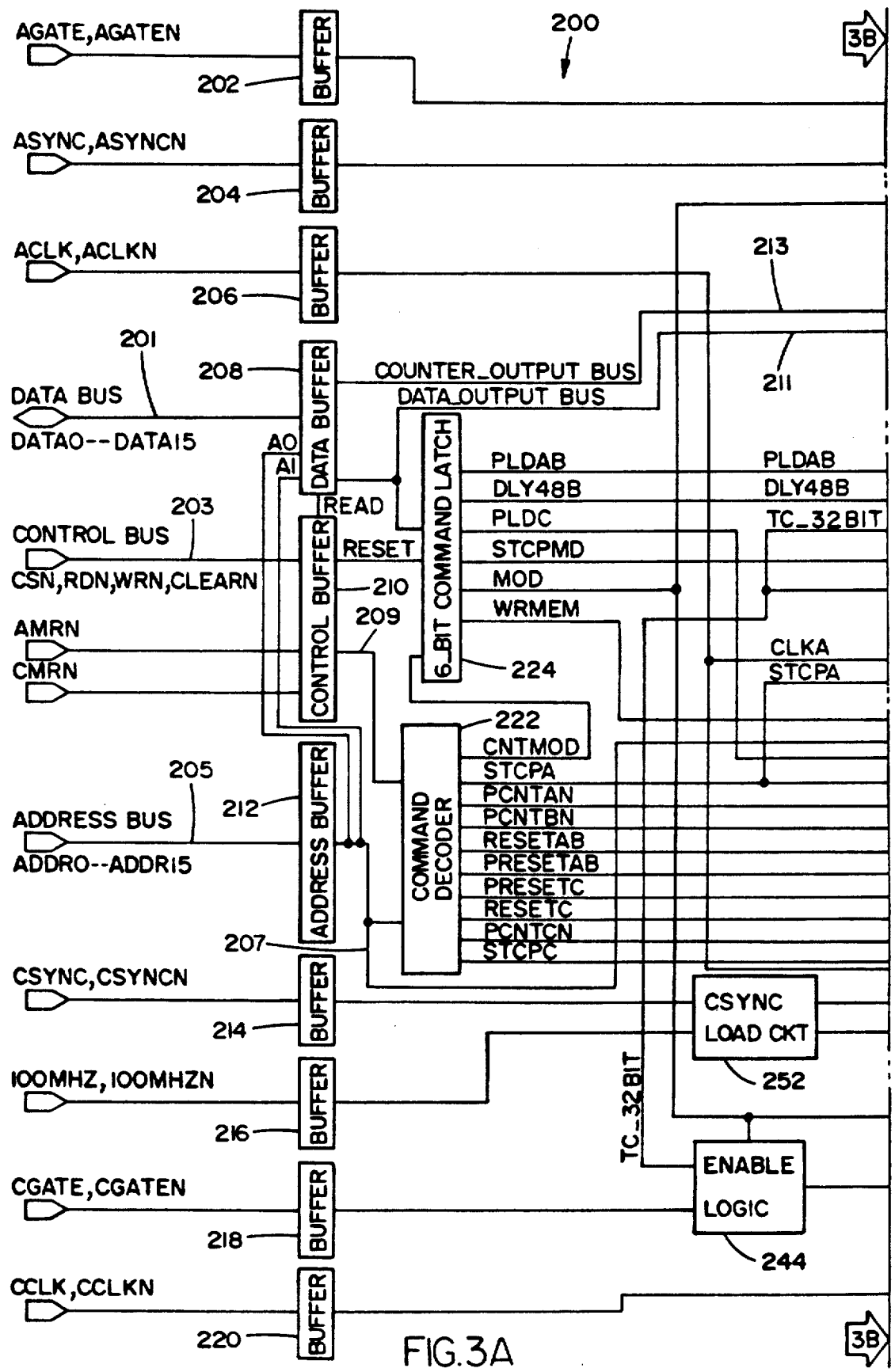
FIG. 3 is a block diagram of the counter group gate array.
Figure 3B:
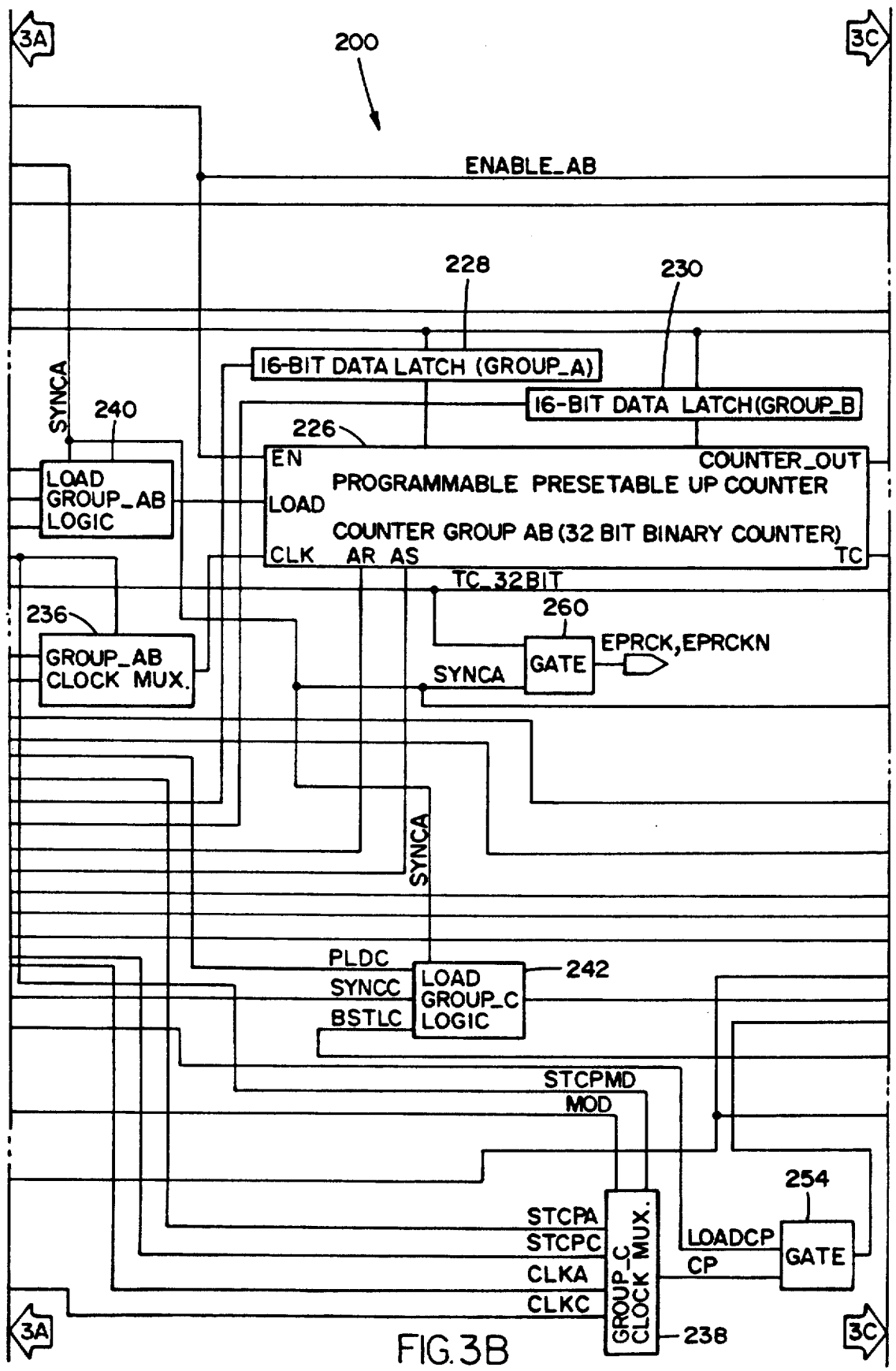
Figure 3C:
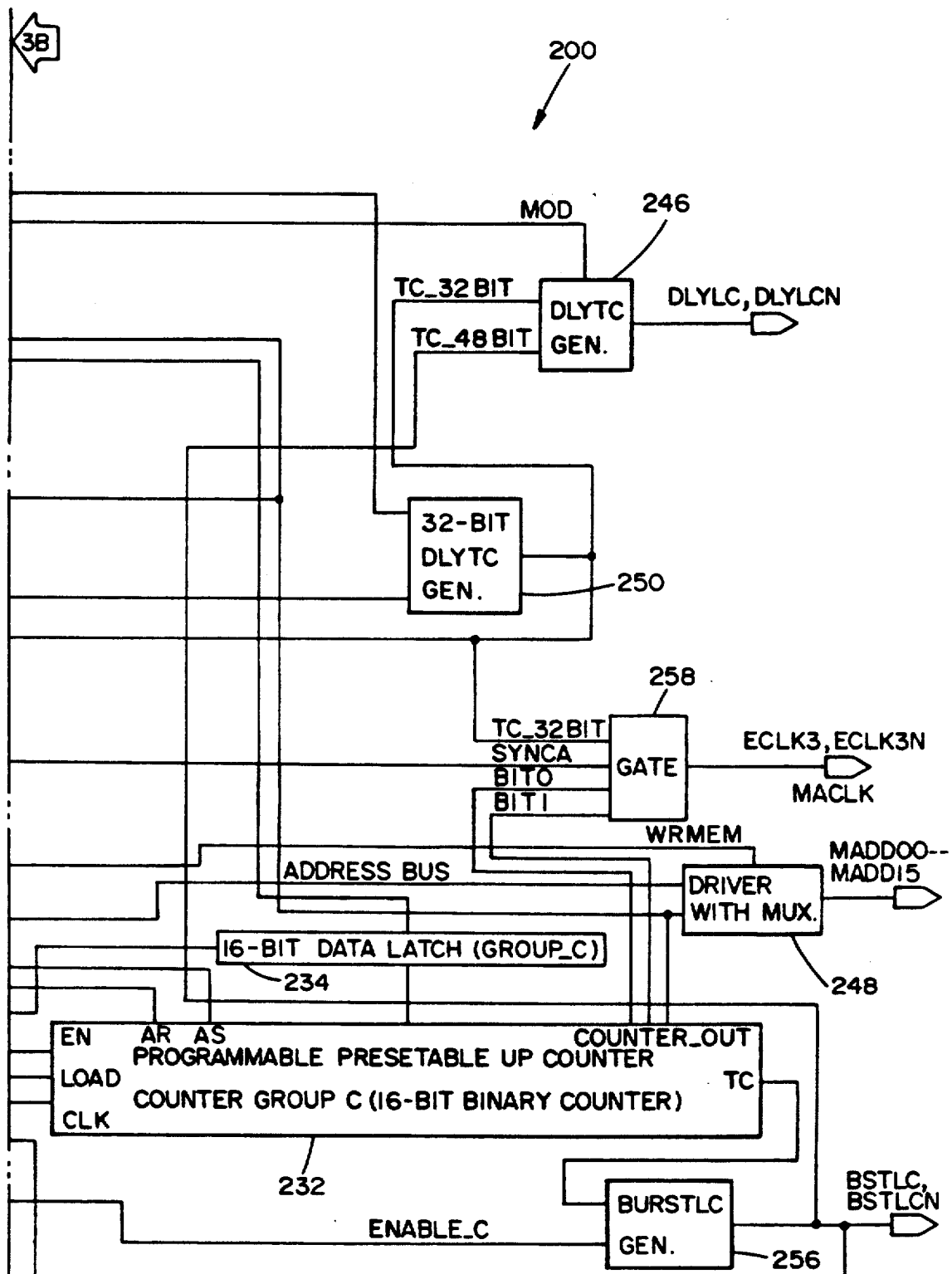

For purposes of illustrating the general counter/timer operation, the workings of one of the gate arrays shall be explained since the gate arrays are identical. The two gate arrays that comprise the counter/timer section of the instrument 10 shall be collectively referred to as the counter/timer gate array 200. FIG. 3 contains a block diagram of the counter/timer gate array 200 illustrating the functional blocks that comprise the array 200.

Referring to FIG. 3, a pair of enable count gate signals for the delay counter group is supplied to a buffer 202 from the system configuration and control circuits gate array 100 shown in FIGS. 1 and 2 if the counter/timer gate array 200 is in the delay and burst mode of operation; otherwise, a pair of enable count gate signals for the main counter group is supplied to buffer 202 from the system configuration and control circuits gate array 100 shown in FIGS. 1 and 2. The signals have been generically named AGATE, and AGATEN but correspond to either DGATE or MGATE, as shown in FIG. 2, depending upon the mode of operation. A pair of synchronization or preset strobes for the delay counter group are supplied to a buffer 204 from the system configuration and control circuits gate array 100 shown in FIGS. 1 and 2 if the counter/timer gate array 200 is in the delay and burst mode of operation; otherwise, a pair of synchronization or preset strobes for the main counter group are supplied to buffer 204 from the system configuration and control circuits gate array 100 shown in FIGS. 1 and 2. The signals have been generically named ASYNC, and ASYNCN but correspond to either DSYNC or MSYNC, as shown in FIG. 2, depending upon the mode of operation. A pair of clock signals for the delay counter group are supplied to a buffer 206 from the system configuration and control circuits gate array 100 shown in FIGS. 1 and 2 if the counter/timer gate array 200 is in the delay and burst mode of operation; otherwise, a pair of clock signals for the main counter group are supplied to buffer 206 from the system configuration and control circuits gate array 100 shown in FIGS. 1 and 2. The signals have been generically named ACLK and ACLKN, but correspond to either CPDLY or CPMAD, as shown in FIG. 2, depending upon the mode operation.

A bidirectional data bus 201 is responsible for carrying data to and from the host microprocessor (not shown) to the counter/timer gate array 200. Data entering or leaving the counter/timer gate array 200 passes through data buffer 208. Data buffer 208 also receives data from address buffer 212. The data transferred is comprised of the two least significant bits of the address field as supplied to address buffer 212. Control bus 203 supplies a plurality of control signals, CSN, RDN, WRN, CLEARN, from the host microprocessor to a control buffer 210. The signals are a chip select signal, a read pulse, a write pulse and a clear signal respectively. Control buffer 210 receives a reset external delay counter group signal from the system configuration and control circuits gate array 100 shown in FIGS. 1 and 2 if the counter/timer gate array 200 is in the delay and burst mode of operation, or a reset external main counter group signal if the counter/timer gate array 200 is in the main counter mode of operation. The signal has been generically named AMRN, but corresponds to CLRD or CLRM, as shown in FIG. 2, depending upon the mode of operation. In addition, control buffer 210 receives a reset external burst counter group signal from the system configuration and control circuit gate array 100 if the counter/timer gate array 200 is in the delay and burst mode of operation; otherwise there is no connection made to the system configuration and control circuits gate array 100 shown in FIGS. 1 and 2. The signal has been generically named CMRN, but corresponds to CLRB as shown in FIG. 2. Address bus 205 provides memory address information from the host microprocessor to the counter/timer gate array 200 through address buffer 212.

A pair of synchronization or preset strobe signals for the burst counter group are supplied to a buffer 214 from the system configuration and control circuits gate array 100 shown in FIGS. 1 and 2 if the counter/timer gate array 200 is in the delay and burst mode of operation; otherwise, no signal is supplied to buffer 214. The signals are generically named CSYNC and CSYNCN, but correspond to BSYNC. A pair of 100 MHz clock signals supplied from an ECL clock driver (not shown) are supplied to a buffer 216 if the counter/timer gate array 200 is in the delay and burst mode of operation; otherwise, no signal is provided to buffer 216. The signals are named 100 MHz and 100 MHzn. A pair of enable count gate signals for the burst counter group are supplied to a buffer 218 from the system configuration and control circuits gate array 100 shown in FIGS. 1 and 2 if the counter/timer gate array 200 is in the delay and burst mode of operation; otherwise, no signal is supplied to buffer 218. The signals are generically named CGATE and CGATEN, but correspond to BGATE, as shown in FIG. 2. A pair of clock signals for the burst counter group are supplied to a buffer 220 from the system configuration and control circuits gate array 100 shown in FIGS. 1 and 2 if the counter/timer gate array 200 is in the delay and burst mode of operation; otherwise, no signal is supplied to buffer 220. The signals have been generically named CCLK and CCLKN, but correspond to CPBST, as shown in FIG. 2.

A command decoder 222 receives address information from buffer 212 via an address bus 207 and control information from control buffer 210 via bus 209. Command decoder 222 decodes the received information and outputs ten command signals. The first command output from command decoder 222 is a load command signal, CNTMOD which is sent to a 6-bit command latch 224. The second command output is a soft strobe, STCPA, for the programmable, presettable up counter_AB 226 and is routed to a group_AB clock multiplexer 236 and a group_C clock multiplexer 238. The third and fourth commands, PCNTAN and PCNTBN, output from command decoder 222 are routed to a 16-bit data latch 228 for the group_A section of the programmable, presettable up counter_AB 226, and a second 16-bit data latch 230 for the group_B section of the programmable, presettable up counter_AB 226 and are used to command the data latches to load the data they contain into the programmable, presettable up counter_AB 226. The fifth and sixth commands, RESETAB and PRESETAB, output from command decoder 222 are routed to the programmable, presettable up counter_AB 226 and are used for setting and resetting of the programmable, presettable up counter_AB 226 respectively. The seventh and eighth commands, PRESETC and RESETC, output from command decoder 222 are routed to a programmable, presettable up counter_C 232 and are used for presetting and resetting of the programmable, presettable up counter_C 232 respectively. The ninth command, PCNTCN, output from command decoder 222 is routed to a third 16-bit data latch 234 and is used to command the data latch to load the data it contains into the programmable, presettable up counter_C 232. The tenth and final command, STCPC, output from command decoder 222 is a soft strobe for the programmable, presettable up counter_C 232 and is routed to the group_C clock multiplexer 238.

The 6-bit command latch 224 receives data from data buffer 208 via data output bus 211, it receives a reset signal, RESET, from control buffer 210 and as stated above, a load command from the command decoder 222. The purpose of the 6-bit command latch 224 is to output signals to configure the counter/timer gate array 200 into a specific mode of operation. The first output of command latch 224 is a parallel load AB counter group signal, PLDAB, which is routed to a load group AB logic circuit 240. The second output of command latch 224 is a disable reload control signal, DLY48B, and it is also routed to the load group_AB logic circuit 240. The third output of command latch 224 is a parallel load C counter group signal, PLDC, which is routed to a load group_C logic circuit 242. The fourth output of command latch 224 is a clock select signal, STCPMD, which is routed to the group_AB clock multiplexer 236 and to the group_C clock multiplexer 238. The fifth output of command latch 224 is a mode selection signal, MOD, which is routed to the group_C clock multiplexer 238, enable logic circuit 244 and to a 32-bit delay counter group top count generator 246. The sixth output of command latch 224 is a memory address bus source signal, WRMEM, which is routed to a driver with multiplexer circuit 248.

The load group_AB logic circuit 240 generates a single load command for the programmable, presettable up counter_AB 226 based on the status of four input signals. The first input into the group_AB logic circuit 240 is a synchronization strobe, SYNCA, for the counter group which is the output signal of buffer 204. The second input received by the group_AB logic circuit 240 is the parallel load AB counter group signal, PLDAB, supplied by command latch 224. The third input received by the group_AB logic circuit 240 is the disable reload control signal, DLY48B, also supplied by the command latch 224. The fourth input received by the group_AB logic circuit 240 is the top count signal, TC_32BIT, for the delay counter group and is supplied from a second 32-bit delay counter group top count generator 250.

The group_AB clock multiplexer 236 generates a single clock pulse for the programmable, presettable up counter_AB 226 based on two input signals and one select signal. The first input to the group_AB clock multiplexer 236 is a clock signal, CLKA, from buffer 206. The second input to the group_AB clock multiplexer 236 is a software strobe for counter AB signal, STCPA, provided by command decoder 222. The selection signal input to the group_AB clock multiplexer 236 is the clock select signal, STCPMD, provided by command latch 224.

A CSYNC load circuit 252 outputs a synchronization signal, SYNCC, to the load group_C logic circuit 242, and a load clock pulse signal, LOADCP, to a first logic gate 254 based on two input signals. The first input signal is a synchronization pulse, CSYNC, from buffer 214, and the second signal is as 100 MHz signal, 100 MHz, from buffer 216.

The enable logic circuit 244 outputs a single enable signal to the programmable, presettable up counter_C 232 and also to a burst counter top count generator 256 based on three input signals. The first input signal is the enable count gate signal, CGATE, from buffer 218. The second input signal is the top count signal, TC_32BIT, generated by the 32-bit delay counter group top count generator 250. The third input signal is the mode selection signal, MOD, from command latch 224.

The load group_C logic circuit 242 generates a single load command for the programmable, presettable up counter_C 232 based on the status of four input signals. The first input into the group_C logic circuit 242 is the synchronization signal, SYNCC, from the CSYNC load circuit 252. The second input received by the load group_C logic circuit 242 is the parallel load C counter group signal, PLDC, supplied by the command latch 224. The third input received by the load group_C logic circuit 242 is the synchronization signal, SYNCA, from buffer 204. The fourth input received by the load group_C logic circuit 242 is a top count signal, BSTLC, from the burst counter top count generator 256.

The group_C clock multiplexer 238 generates a single clock pulse to gate 254, which will be then fed into the programmable, presettable up counter_C 232. The clock pulse output is generated based on four input signals and two select signals. The first input to the group_C clock multiplexer 238 is a soft strobe for programmable, presettable up counter_AB 226, STCPA, provided by command decoder 222. The second input to the group_C clock multiplexer 238 is a soft strobe for programmable, presettable up counter_C 232, STCPC, provided by command decoder 222. The third input to the group_C clock multiplexer 238 is a clock signal, CLKA, provided by buffer 206. The fourth input to the group_C clock multiplexer 238 is a clock signal, CLKC, provided by buffer 220. The first and second selection signal inputs to the group_C clock multiplexer 238 are a mode command signal, MOD, and clock select signal, STCPMD, which are provided by the command latch 224. As mentioned above, gate 254 receives the clock pulse, CP, from the group_C clock multiplexer 238, and in addition, it also receives a load clock pulse signal, LOADCP, from the CSYNC load circuit 252. The gate 254 then outputs the clock pulse to the programmable, presettable up counter_C 232.

The 16-bit data latch for group A 228 of the programmable, presettable up counter_AB 226 receives data from data buffer 208 via data_output bus 211 and the load data word in buffer for counter A signal, PCNTAN, from command decoder 222. Based on the receipt of the load signal, PCNTAN, from command decoder 222, the 16-bit data latch 228 provides the data from bus 211 to the programmable, presettable up counter_AB 226. The 16-bit data latch for group B 230 of the programmable, presettable up counter_AB 226 receives data from buffer 208 via data_output bus 211 and the load data word in buffer for counter B signal, PCNTBN, from command decoder 222. Based on the receipt of the load signal, CP from command decoder 222, the 16-bit data latch 230 provides the data from data_output bus 211 to the programmable, presettable up counter_AB 226. The 16-bit data latch for group_C 234 receives data from data buffer 208 via data_output bus 211 and the load data word in buffer for counter C signal, PCNTCN, from command decoder 222. Based on the receipt of the load signal, PCNTCN, from command decoder 222, the 16-bit data latch 234 provides the data from data_output bus 211 to the programmable, presettable up counter_C 232.

The programmable, presettable up counter_AB 226 is a two stage 32-bit binary counter. Each stage is a 16-bit binary counter and referred to as group A and group B counters. Counter_AB 226 receives data for the group A counter from 16-bit data latch 228 and data for the group B counter from 16-bit data latch 230. The counter_AB 226 also receives five control signals. The first control signal is an enable signal, AGATE, from buffer 202, which simply enables the counter_AB 226. The second control signal is a load signal, LOAD, from the load group_AB logic circuit 240 and it allows data to be loaded into the counter_AB 226. The third control signal is a clock signal, CLK, from the group_AB clock multiplexer 236 which provides the necessary timing signal for the counter_AB 226. The fourth and fifth control signals are the set and reset signals, PRESETAB and RESETAB, from the command decoder 222. These signals allow the programmable, presettable up the counter_AB 226 to be set and reset. The output of programmable, presettable up counter_AB 226 is sent to data buffer 208 via a counter_output bus 213 and also to a driver with multiplexer circuit 248 via bus 213. The programmable, presettable up counter_AB 226 also outputs the top count, TC, to 32-bit delay counter group top count generator 250.

The programmable, presettable up counter_C 232 is a one stage 16-bit binary counter. Programmable, presettable up counter_C 232 receives data from 16-bit data latch 234. The programmable, presettable up counter_C 232 also receives five control signals. The first control signal is an enable signal, EN, from enable logic 244, which simply enables the counter_C 232. The second control signal is a load signal, LOAD from the load group_C logic 242 and it allows data to be loaded into programmable, presettable up counter_C 232. The third control signal is a clock signal, CLK, from gate 254 which provides the necessary timing signal for programmable, presettable up counter_C 232. The fourth and fifth control signals are the set and reset signals, PRESETC and RESETC from the command decoder 222, these signals allow programmable, presettable up counter_C 232 to be set and reset. The output of programmable, presettable up counter_C 232 is sent to data buffer 208 via counter_output bus 213 and also to the driver with multiplexer circuit 248 via bus 213. The programmable, presettable up counter_C 232 also outputs the top count, TC, to a burst counter group top count generator 256. In addition, programmable, presettable up counter_C 232 also outputs Bit 0 and Bit 1 of the output data to a second gate 258.

The 32-bit delay group top count generator 250 receives the top count signal, TC, from programmable, presettable up counter_AB 226 and the enable count gate signal, AGATE, from buffer 202. Based on these two inputs, the 32-bit delay group top count generator 250 outputs the 32-bit top count signal, TC_32BIT, to the delay group top count generator 246, to gate 258, to gate 260, to the load group_AB logic circuit 240, and to the enable logic circuit 244.

The delay group top count generator 246 receives the mode signal, MOD, from the 6-bit command latch 224, the 32-bit top count signal, TC 32BIT, from the 32-bit delay group top count generator 250, and the 48-bit top count signal, TC_48BIT, from the burst group top count signal generator 256. Based on these input signals, the delay group top count generator 246 outputs the delay group top count signals, DLYLC and DLYLCN, to the system configuration and control circuits gate array 100 shown in FIGS. 1 and 2 if and only if the counter/timer group 200 is in the delay and burst mode of operation. If the counter/timer gate array 200 is in the main counter mode of operation, then there is no physical connection to the system configuration and control circuits gate array 100.

Gate 258 receives the top count signal, TC_32BIT, from the 32-bit delay group top counter generator 250, it receives the synchronization signal, ASYNC, from buffer 204, and it receives bit 0 and bit 1 from the programmable, presettable up counter_C 232. Bit 0 and bit 1 are decoded by the data flow management gate array 300, shown in FIG. 1, so that data flow management gate array 300 can be synchronized to the main counter group 200c shown in FIG. 1. Based on these inputs, gate 258 outputs a pair of enable clock 3 signals, ECLK3 and ECLK3N, to the data flow management gate array 300 shown in FIG. 1. This signal is only sent to the data flow management gate array 300 when the counter/timer gate array 200 is in the main counter mode of operation; otherwise, there is no physical connection for this signal between the counter/timer gate array 200 and the data flow management gate array 300.

The driver with multiplexer circuit 248 receives address information via address bus 207 and data from programmable, presettable up counter_AB 226 and programmable, presettable up counter_C 232 via counter_output bus 213. In addition, the driver with multiplexer circuit 248 receives a memory address bus source signal, WRMEM, from the command latch 224. Based on these inputs, the driver with multiplexer circuit 248 outputs memory address range MADD02 through MADD11 to the high speed memory 42 shown in FIG. 1, while memory address ranges MADD00 through MADD01 and MADD12 through MADD15 are not connected to the high speed memory 42. The outputs described above are only physically connected when the counter/timer gate array 200 is in the main counter mode of operation.

The burst group top count generator 256 receives the top count signal, TC, from the programmable, presettable up counter_C 232 and an enable signal, ENABLE_C, from enable logic circuit 244. Based on these inputs, the burst group top count generator 256 outputs the top count signals, BSTLC and BSTLCN, for the burst counter group to the system configuration an control circuits gate array 100, shown in FIG. 1, when the counter/timer gate array 200 is in the delay and burst mode of operation; otherwise, there is no connection to the other device. In addition, the burst group top count generator 256 outputs the top count signals, BSTLC and BSTLCN, to the delay group top count generator 246 and to the load group_C logic circuit 242.

Gate 260 receives the synchronization pulse, ASYNC, from buffer 204 and the top count signal, TC_32BIT, from the 32-bit delay group top count generator 250. Based on these two signals, the gate 260 outputs a pair of enable preclock signals, EPRCK and EPRCKN, to the data flow management gate array 300 shown in FIG. 1 when the counter/timer gate array 200 is in the main counter mode of operation; otherwise there is no physical connection to any other device.

The aforementioned functions and capabilities of the counter/timer gate array 200 are more fully explained in subsequent paragraphs that deal with the overall operation of the instrument 10 in different modes of operation as shown in FIGS. 5-7.

The data flow management gate array 300 shown in FIG. 1 is realized in two identical gate arrays, wherein each gate array, called slice 1 and slice 2, handles one half of the memory traffic into and out of the external high speed memory 42. The purpose of the data flow management gate array 300 is to provide traffic police type functions for the instrument 10. The data flow management gate array 300 is responsible for the smooth data flow between the external memory 42 and the host microprocessor (not shown). In addition, when necessary to do so, the data flow management gate array 300 initiates and controls the analog to digital conversion process as well as the digital to analog conversion process. The operation of the data flow management gate array 300 will be explained in the following paragraphs.

Figure 4A:
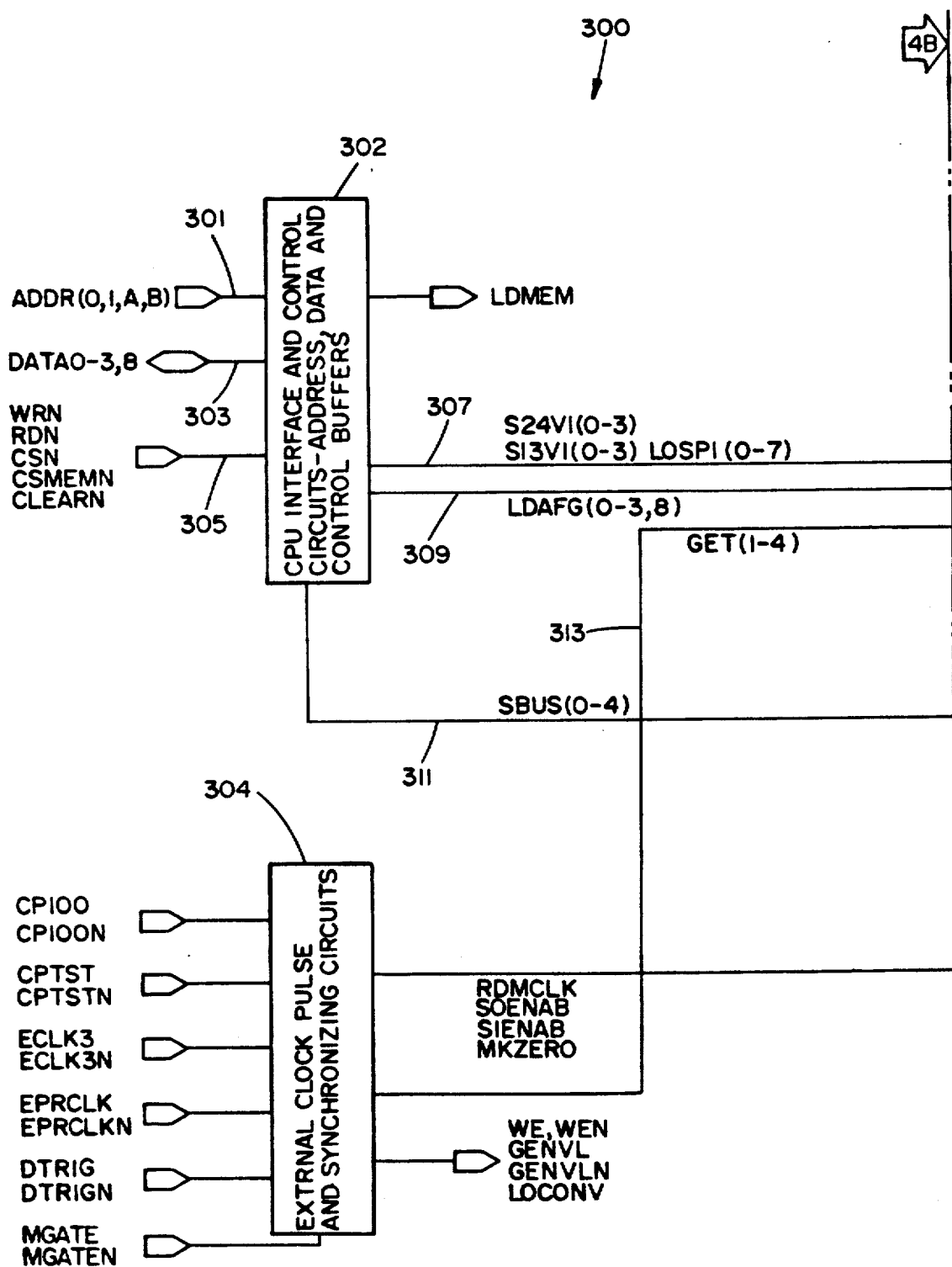
FIG. 4 is a block diagram of the data path management gate array.
Figure 4B:
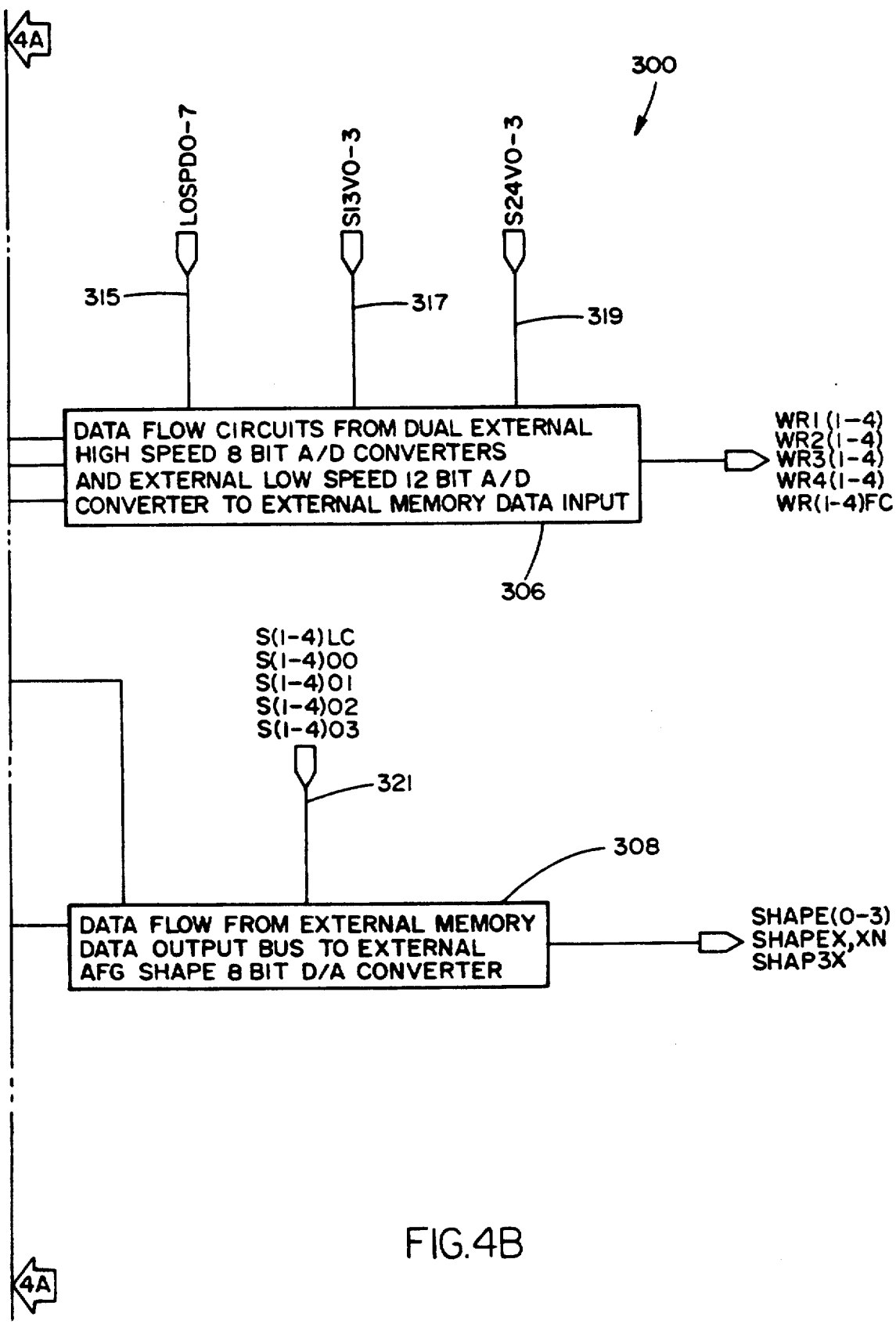

For purposes of illustrating the general data flow management gate array operation, the operation of one of the identical gate arrays shall be explained. FIG. 4 contains a block diagram of the data flow management gate array 300 illustrating the functional blocks of the gate array 300.

Referring now to FIG. 4, a CPU address bus 301 provides address signals ADDR0, ADDR1, and ADDRA and ADDRB to a CPU interface and control circuits block 302. A CPU data bus 303 provides a bidirectional data link between the host microprocessor (not shown) and the data flow management gate array 300. A CPU control bus 305 provides a plurality of control signals to the CPU interface and control circuits block 302. The first signal, WRN, is a write pulse, the second signal, RDN, is a read pulse, the third signal CSN, is a chip select signal, the fourth signal, CSMEMN, is a direct memory access signal, and the fifth signal CLEARN, is clear pulse. The CPU interface and control circuits block 302 provides a LDMEM signal to external high speed memory 42 shown in FIG. 1. The LDMEM signal is a load memory flag. In addition, interface and control circuits block 302 is connected to a data flow circuits block 306 via buses 307 and 309 which carry low speed and high speed A/D converter 36 and 38, as shown in FIG. 1, information and load arbitrary function generator information respectively. Bus 311 connects CPU interface and control circuits block 302 to a second data flow circuits block 308 and which carries information concerning the output data to the D/A converter 40 shown in FIG. 1. Basically, the CPU interface and control circuits block 302 takes in external information including address, data, and control information, and provides a load memory signal as well as handling information transfer internally. The CPU interface and control circuits block 302 comprises address buffers, data buffers and control buffers.

An external clock pulse and synchronization circuits block 304 receives a plurality of input signals. The first set of inputs are 100 MHz clock signals, CP100 and CP100N which are provided by the system clock (not shown). The second set of signals are test clock signals, CPTST and CPTSTN, which are provided by a test clock (not shown). The third set of signals are external synchronization clock signals, ECLR3 and ECLK3N, which are from the counter/timer gate array 200 shown in FIGS. 1 and 3. The purpose of ECLK3 and ECLK3N is to synchronize operation of the counter/timer gate array 200 with that of the data flow management gate array 300. The fourth set of signals are external prescaler synchronization clock signals, EPRCLK and EPRCKN, which are also provided by the counter/timer gate array 200. The fifth set of signals are digitizer trigger signals, DTRIG and DTRIGN, which are also provided by the system configuration and control circuits gate array 100. The purpose of the DTRIG and DTRIGN signals are to resynchronize the memory address counters. The sixth set of signals are enable main count gate signals, MGATE and MGATEN, which are also provided by the system configuration and control circuits gate array 100. The external clock pulse and synchronization circuits block 304 outputs a plurality of control signals based on the above input signals. The first output is a read memory clock pulse signal, RDMCLK, which is output to the second data flow circuits block 308. The second and third outputs are also provided to data flow circuits block 308, and are select signals, S0ENAB and S1ENAB, for decoding data to be output to either of the digital to analog converters 36 or 38 as shown in FIG. 1. The fourth output signal, MKZERO, is also provided to data flow circuits block 308, and is used to force the output of the arbitrary function generator line driver 44 to zero volts. The external clock pulse and synchronizing circuits block 304 also outputs a set of write enable signals, WE and WEN to the external high speed memory gate array 42 shown in FIG. 1, a set of start AFG D/A conversion request signals, GENVL and GENVLN, to the D/A 40, and a conversion request signal, LOCONV, for the low speed A/D 36 to the low speed A/D 36. In addition, external clock pulse and synchronizing circuits block 304 provides data flow circuits block 306 with a set of four strobes, GET1-GET4, which are used to set the times for transferring data so as to maintain data stability throughout the write cycle. The GET1-GET4 signals are transferred via bus 313. The external clock pulse and synchronizing circuits block 304 outputs commands which control various data transfer and conversion processes or sequences based on inputs from clock sources and outputs generated by the system configuration and control circuits gate array 100 and the counter/timer gate array 200 both of which are shown in FIG. 1.

Data flow circuits block 306 receives input data from the low speed A/D converter 36 via bus 315, input data comprising only odd bits from the high speed A/D 38, via bus 317, and input data comprising only even bits from the high speed A/D 38, via bus 319. In addition, as stated previously, data flow circuits block 306 is connected to the CPU interface and control circuits block 302 via buses 307 and 309 for receiving address, data, and control information, and is also connected to external clock pulse and synchronizing circuits block 304 via bus 313 which carries the GET1-GET4 signals for timing. Data flow circuits block 306 outputs twenty signals to the external high speed memory 42, shown in FIG. 1. These signals comprise four arrays of five signals each. The four arrays of five signals are WR10-WR13, WR1FC, WR20-WR23, WR2FC, WR30-WR33, WR3FC, and WR40-WR43, WR4FC. These signals are all stored in the external high speed memory 42 shown in FIG. 1. Data flow circuits block 304 provides circuitry for controlling of the data flow from the A/D's 36 and 38 shown in FIG. 1 to the external high speed memory 42 shown in FIG. 1 based on various control signals and information provided by the CPU interface and control circuits block 302 and the external clock pulse and synchronizing circuits block 304.

Data flow circuits block 308 receives twenty inputs from the external high speed memory 42 shown in FIG. 1 via bus 321. The twenty inputs arrive from external high speed memory 42 in four arrays of five signals each. The four arrays of five signals are S100-S103, S1LC, S200-S203, S2LC, S300-S303, S3LC and S400-S403, S4LC. There signals contain data to be digitized. In addition, data flow circuits block 308 receives the four control signals, RDMCLK, S0ENAB, S1ENAB and MKZERO from external clock pulse and synchronizing circuits block 304 and data from bus 311. Data flow circuit block 308 outputs data to be converted into an analog signal representing an arbitrary function. The data signals, SHAPE0-SHAPE3, and control signals SHAPEX, SHAPXN and SHAP3X, are output to the D/A 40 shown in FIG. 1. Data flow circuits block 308 provides circuitry for controlling of the data flow from the external high speed memory 42 shown in FIG. 1 to the D/A converter 40 also shown in FIG. 1 based on various control signals and information provided by the CPU interface and control circuits block 302 and the external clock pulse and synchronizing circuits block 314.

The aforementioned functions and capabilities of the data flow management gate array 300 are more fully explained in subsequent paragraphs that deal with the overall operation of the instrument 10 in different modes of operation as shown in FIGS. 5-7.

The software reconfigurable instrument can be effectively utilized in an automatic test equipment environment during test sequences by dynamically changing the system architecture to fit immediate test requirements. The present invention provides those circuit groups that can be shared to perform the required test system functions and partitions the system in a way that best utilizes the various resources. When the software reconfigurable instrument is configured as a counter/timer it requires at a minimum, two input channels with programmable triggering level, attenuator and coupling modes; two counter groups; and an input/output port to a host central processing unit. When the instrument is configured as a waveform digitizer it requires at a minimum one input channel; three counter groups; high speed memory; analog to digital converters; and an input/output port to a host central processing unit. When the instrument is configured as an arbitrary function generator it requires at a minimum, two input channels, where one is set up as a trigger input; three counter groups; high speed memory; a digital to analog converter; an arbitrary function generator driver; and an input/output port to a host central processing unit. All of the above resources are provided on a single circuit card and are utilized as necessary to perform the selected instrument function. A more detailed description of the use of the instrument 10, shown in FIG. 1, is given as specific modes of operation of the instrument are discussed and described and which are illustrated in FIGS. 5-7.

Referring now to FIG. 5, there is shown a block diagram illustrating the software reconfigurable instrument 10 configured as a 100 MHz counter/timer. Signals enter the instrument 10 via any combination of channels 12, 14 and 16 depending upon the counting or timing function desired. The type of signals that enters the instrument 10 in the counter/timer mode of operation are analog signals with a frequency range of DC to 100 MHz and an amplitude of up to 200 volts Root Mean Square (RMS). The input signals then pass through the various forms of analog signal processing as described previously. In input channels 12 and 14, the input signals pass through dual programmable attenuators 18 and 20, signal conditioning circuitry 24 and 26 and programmable level comparators 30 and 32. In input channel 16, which is used basically as a gate input in the counter/timer mode of operation of the instrument 10, the analog signal processing is more limited in the sense that although the analog circuitry is the same as in channels 12 and 14, channel 16 does not have full programming capability. The inputs to channel 16 are passed through a fixed attenuator 22, signal conditioning circuitry 28 and a programmable level comparator circuit 34. A gate input is one in which an incoming signal causes a particular action to occur when the incoming signal is at a predetermined level, which is called the gate level. The action only occurs if and only if the gate level is reached; otherwise no action takes place. The three possible input signals exiting programmable level comparator circuits 30, 32, and 34 are now properly conditioned for entrance into the digital section of the instrument 10, and as stated previously, the first section the conditioned signals enter is the system configuration and control circuits gate array 100. As stated previously, the gate array 100 is responsible for configuring the instrument 10 based on host microprocessor instructions (not shown).

Based on commands from the host microprocessor (not shown) the instrument 10 configured as a counter/timer can perform a variety of counting and timing functions. Included among these functions, but not limited to, are frequency measurement, period averaging, time interval averaging, A/B ratio measurements, duty cycle measurements, and phase angle measurements. As stated previously, the host microprocessor has access to a command register stack 102, shown in FIG. 2, of the system configuration and control circuits gate array 100 that maintains the current status of the instrument 10. The data loaded in the command stack 102 is decoded and processed whereby control pulses are generated for the set of three counter groups 200a, 200b and 200c. Based on the type of counting/timing function, the system configuration and control circuits gate array 100 configures the various counter groups 200a, 200b and 200c, which are physically located on two gate arrays to perform these various functions.

In the frequency measurement mode of counter/timer operation, command word 1 of the command stack 102 shown in FIG. 2 sets up the delay counter group 200a to generate timed gates for frequency measurements. Basically, what this means is that the delay counter group 200a opens a window in time thereby providing a given amount of time in which to make the necessary number of counts which in turn is used to determine the frequency of the incoming analog signal. The frequency measurement mode requires a fixed precise time interval during which the accumulator is enabled. The main counter group 200c serves as the accumulator which keeps track of the number of counts or clock pulses that elapse during the open window cycle. The clock source to the accumulator is derived from the selected channel 12 or 14 being measured. Command words 2 and 3 are not necessary in the frequency measurement mode and therefore, are not discussed in this section; however, they will be discussed in subsequent paragraphs. Command word 4 is used to control the accumulator gating and preset timing. Command word 5 defines start and stop conditions for the accumulator, and command word 6 selects trigger arm conditions for recognizing accumulator start and stop conditions. Basically, in the frequency measurement mode, the delay counter group 200a sets up a specific time interval in which the main counter group 200c counts occurances of a specific event such as the number of times a periodic analog signal crosses the zero line.

The remaining functions listed above, period averaging, time interval averaging, A/B ratio measurements, duty cycle measurements and phase angle measurements are set up using command words 2 and 3 of command stack 102 shown in FIG. 2. Command word 2 sets up the burst counter group 200b start and stop conditions. During period and timer interval averaging modes, the burst counter group 200b maintains the multiple of intervals during which the reference clock is being accumulated by the main counter group 200c or accumulator. In A/B ratio measurements, the burst counter group 200b functions as an accumulator for the denominator count of the ratio and is started and stopped on the same conditions selected for the main counter group 200c accumulator. Phase angles and duty cycle measurements may be performed in a single setup. The delay and burst counter groups 200a and 200b are configured or programmed to act as a single b 48 bit accumulator. Command word 3 enables selected trigger sources from input channels 12, 14 and 16. This command word also allows selection of the burst counter group 200b clock.

Channel 16 is usually used as a gate input as mentioned previously. This gate input is necessary under certain conditions such as in the instance that the frequency can be measured only at a specific time, and this time is dictated by gate input 16. The results of all measurements are passed directly from the counter groups 200a, 200b and 200c to the host microprocessor (not shown) via the system data bus 213 as shown in FIG. 3. The counter groups 200a, 200b and 200c contain information that the host microprocessor processes and utilizes for the various functions as required by the associated test equipment.

Referring now to FIG. 6, there is shown a block diagram illustrating the software reconfigurable instrument 10 configured as an arbitrary function generator. Signals enter the instrument 10 via input channels 12 and 14 only. Channel 12 is a trigger input channel in this mode of operation of the instrument 10, which means that it is looking for a rising or falling edge of a signal for causing a particular action to occur, and channel 14 is a gate input which means that it is looking for a particular level of an incoming signal. The host microprocessor (not shown) determines the type of signal it wants generated and provides the necessary control signals and data to the data flow management gate array 300.

An external high speed memory gate array 42 stores a digital file from the host microprocessor (not shown) representing the desired waveform to be digitized. There is no direct link between the external high speed memory gate array 42 and the host microprocessor. The data flow management gate array 300 provides the link between the host microprocessor and the external high speed memory gate array 42. The external high speed memory gate array 42 is comprised of four identical 1K×10 bit arrays which are time division multiplexed to form one high speed 1k×40 memory array. Four normalized byte (8 bit) wide shape patterns are accessed from the external high speed memory gate array 42 as a single 40-bit message at one quarter the pattern segment duration time. The multiplexing scheme is built into the data flow management gate array's 300 architecture. This scheme allows segment duration times shorter than the memory access time for the data flow management array 300. The two extra bits in each array are for storing information such as function start and stop points. The way the data flow management gate array 300 is set up, slice 1, as shown in FIG. 6, of array 300 receives a synchronizing bit to indicate the start of a function and slice 2, as shown in FIG. 6 of array 300 receives a synchronizing bit to indicate the end of a function. The host microprocessor can provide any shaped function to the external high speed memory 42 in digital data format. In addition, the pattern can be a series of digital pulses when the arbitrary function generator substitutes as a pulse generator.

The flow of data to and from the external high speed memory 42 and the host microprocessor (not shown) and digital to analog converter 40 is controlled by the data flow management gate array 300. Each slice of the gate array handles one half of the memory traffic. Since the data flow management gate array 300 is connected to the host microprocessor via a system data bus 303 and an address bus 301 shown in FIG. 4, commands from the host microprocessor are fed directly into the data flow management gate array 300 whereby it is processed and utilized. The digital data representing the function created by the host microprocessor is shifted out of the external high speed memory gate array 42 by the data flow management gate array 300 and into a high speed digital to analog video converter 40. The digital to analog video converter 40 is just a flash digital to analog converter. The analog signal output from the digital to analog converter 40 is sent to the arbitrary function generator line driver 44 where it is conditioned and buffered. The arbitrary function generator output, supplied by D/A 40, is a normalized function which can be filtered and scaled to meet various requirements by the arbitrary function line driver 44. Based on commands from the host microprocessor the instrument 10 can be configured as an arbitrary function generator. As stated previously, the data flow management gate array 300 receives commands from the host microprocessor which configure the data flow management gate array 300 for the arbitrary function generator mode of operation; however, the system configuration and control circuits gate array 100 must also be programmed to configure the counter groups 200a, 200b and 200c. Command word 1 of command stack 102 shown in FIG. 2 sets up the synchronizing delay start time and delay counter triggering modes of the delay counter group 200a. Basically the delay counter group 200a forms a time base generator equal to the segment duration time cascaded to the memory address counter which is the main counter group 200c. Command word 2 of command stack 102 sets up the burst counter group 200b start and stop conditions. The 16-bit burst counter group 200b determines the number of memory cycle iterations that is allowed after the instrument 10 is triggered. A complete memory cycle is defined by the stored arbitrary function. It should be noted that the trigger input, input to channel 12, is pre-programmed to trigger at the detection of the appropriate predetermined signal to be digitized. As stated earlier, the external memory high speed gate array 42 consists of four sets of 10 bits, eight bits of which define the functions normalized amplitude and the remaining two bits define the start and end of the iteration. An iteration usually includes n patterns where n equals at least one function. The burst counter group 200b is normally programmed to terminate after the programmed number of patterns is generated. In all arbitrary function generator modes, the burst and main counter group 200b and 200c start conditions should be set identically. Command word 3 of command stack 102 enables selected trigger sources from any of the analog input channels 12, 14 or 16 and delay counter group top count from the delay counter group 200a. Command word 4 of command stack 102 selects the segment duration/memory address counter modes and clock source. The system configuration and control circuits gate array 100 can be programmed to output a single pattern iteration as defined by the start address of the function to the memory address location. Command word 5 of command stack 102 defines start and stop conditions for the segment duration/memory address counter which is the main counter group 200c. Command word 6 of command stack 102 selects trigger arm conditions for recognizing main counter group 200c start and stop conditions. The arm conditions for starting and exiting to main counter group 200c sequence is programmed by this command word.

Basically, the delay counter group 200a sets the delayed trigger time and the burst counter group 200b sets the number of memory cycle iterations. The main counter group 200c traces the analog function in a stair step manner by counting segment duration and then updating memory addresses. All of the counter groups 200a, 200b and 200c information is passed through to the host microprocessor (not shown) via the counter output bus 213 as shown in FIG. 3, and the digital data from the host microprocessor is brought to the external high speed memory gate array 42 via the data flow management gate array 300.

The system configuration and control circuits gate array 100 can be programmed by the host microprocessor (not shown) to allow various re-triggering options such as single events, multiple events, single bursts, multiple bursts and continuous run in the arbitrary function generator mode of operation of the instrument 10.

Referring now to FIG. 7, there is shown a block diagram illustrating the software reconfigurable instrument 10 configured as a 100 MHz digitizer. Signals enter the instrument 10 via input channel 12 only. Channel 12 brings in the analog signal to be digitized and performs all the analog conditioning described earlier. The limits on the analog signal are the same as the limits specified in the counter/timer section; namely, a frequency range of DC to 100 MHz and amplitude of up to 200 volts RMS. The input signal is routed to a high speed 8-bit video analog to L digital converter 38 or a high resolution 12-bit analog to digital converter 36 depending if the instrument 10 is in a high or low speed digitizing mode of operation. The high resolution 12-bit converter 36 is a low speed converter and reduces the bandwidth of the incoming signal. The input signal is also fed into the system configuration and control circuits gate array 100 and is used as a trigger reference that will be discussed subsequently.

Data from one of the analog to digital converters 36 or 38 is then routed to the data flow management gate array 300. As stated previously, each slice of the data flow management gate array 300 handles one half of the memory traffic. The data flow management gate array 300 is connected to the host microprocessor (not shown) via address bus 301, data bus 302 and control bus 305 which are shown in FIG. 4. The commands from the host microprocessor are fed directly into the data flow management gate array 300. Through the host microprocessor, the data flow management gate array 300 can be programmed to set the instrument 10 into a high speed sampler mode of operation or a low speed sampler mode of operation. The four basic commands are two read low speed analog to digital outputs and two read high speed analog to digital outputs.

When configured as a high speed 8-bit resolution digitizer, the 100 MHz analog to digital converter 38 is capable of sampling at faster than the memory access rate and provision is made to store sampled data in a separate buffer in sequential fashion. The digitizer will be initialized and continuously taking samples. The external high speed memory gate array 42 is organized as a circular file for quick access. The samples of interest are those samples recorded after an external trigger, post trigger samples and pretrigger samples. As stated previously, the trigger signal is provided by input channel 12. Normally the digitizer mode will be programmed to capture a fixed number of samples by the host microprocessor (not shown) after detection of a trigger event. The exact time the trigger appears during sampling is required in order to establish a time reference and differentiate pretrigger from post trigger data. Because the trigger may have occured in any of the four sampling time slots during any single memory cycle, circuitry was added to data flow management gate array 300 that loads a timing mark in a single array bit location. The maximum number of useful samples recorded in 4096. The user specifies the number of samples to capture after an external trigger. The difference between that number and 4096 will be the number of pretrigger samples available in memory. This assumes that the digitizer was sampling data long enough to fill the memory with meaningful data.

When configured as a low speed 12-bit high resolution digitizer, the maximum sampling rate is limited by the analog to digital converter 36, not the data flow management gate array 300 operation. The external high speed memory gate array 42 is configured as two 1024×20 blocks where 12 bits are dedicated for sampled data. There are two samples per memory cycle and they are initiated by the start conversion signal in this mode of operation, maximum sampling rate is restricted to the sampling rate of the converter.

Based on commands from the host microprocessor (not shown) the instrument 10 can be configured as a 100 MHz digitizer. As stated previously, the data flow management array 200 receives commands from the host microprocessor which configures this particular gate array 300 for the digitizer mode of operation; however, the system configuration and control circuits gate array 100 must also be programmed to configure the counter groups for their participation in the process. Command word 1 from command stack 102 shown in FIG. 2 sets up the synchronizing delay start time and delay counter group 200a triggering modes. The minimum delay syncronization time is restricted by hardware overhead to 90 ns or 9 clocks. The maximum delay time is the clock reference period or 42 seconds. This delay time is equivalent to a post trigger delay. The burst counter group 200b can be programmed to store 4096 samples plus any number of additional samples up to $2^{16}$. The delay time can then be calculated from the product of the programmed sample duration time and the number stored in the burst counter group 200b in excess of 4096. Command word 2 of command stack 102 sets up the samples to go counter, which is the burst counter group 200b, start and stop conditions. The burst counter group 200b is used as a samples-to-go counter. The burst group counter 200b is initially loaded with the number of samples to be stored in memory and decremented by the top count of the segment duration counter, which is the main counter group 200c, and functions as a time between samples counter in this mode of operation. The burst counter group 200b is programmed to terminate after the programmed number of samples is taken. Command word 3 of command stack 102 enables selected trigger sources from channels 12, 14 or 16 and delay counter group top count. The burst counter group clock source is selected. In the digitizer mode, the burst counter clock is the memory address counter clock or top count from the time between samples counter which is the main counter group 200c. Command word 4 from command stack 102 controls the time between samples/memory address counter and clock source. In this mode, command word 4 is programmed to allow one recording event. Command word 5 from command stack 102 defines start and stop conditions for the time between samples/memory address counter. The digitizer is normally set up with the samples to go counter, burst counter group 200b, programmed for the number of samples that will be recorded after the trigger event occurs. If pretrigger data is to be sampled, the digitizer main group counter 200c must be enabled and generating a memory address pointer. A software initiated pulse from the host microprocessor should be used to start sampling data, and the top count of the samples to go burst counter group 200c should be used to stop sampling. In effect, the external high speed memory array 42 is arranged as one continuous circular file where sampled data overwrites previously stored data. Command word 6 from command stack 102 selects trigger arm conditions for recognizing all start and main group 200c stop conditions. In the digitizer mode of operation, the arm start condition is normally the default software initiated request.

The digitized waveform data stored in the external high speed memory gate array 42 is then passed to the host microprocessor (not shown) through the data flow management gate array 300 where it can be utilized bu the ATE.

While the invention has been particularly shown and described with respect to the preferred embodiments thereof, it should be understood by those skilled in the art that the foregoing and other changes in form and details may be made therein without departing from the spirit and scope of the invention which should be limited only by the scope of the appended claims.

What is claimed is:

1. A reconfigurable signal processing device comprising:
   (a) input means for providing input signals to be processed;
   (b) a plurality of programmable counter modules, each of said counter modules being reconfigurable to perform one of a plurality of selected signal processing functions on said input signals, said plurality of programmable counter modules are reconfigurable as a counter/timer, an arbitrary function generator, and a digitizer to digitize waveforms;
   (c) confirguration and control circuit means coupled to said input means, to a computer means and to said counter modules for providing control signals in response to command signals from said computer means and selected input signals to selectably reconfigure and to selectably interconnect said plurality of counter modules to form a selected signal processing device;
   (d) memory means coupled to said input means, to least one of said counter modules, and to said computer means for performing required memory functions corresponding to the selected signal processing device formed by said configuration and control circuit means.

2. The device of claim 1, further including memory interface circuit means for managing data flow in and out of said memory means.

3. The device of claim 1 wherein said counter modules are implemented in at least one software programmable gate array.

4. The device of claim 2 wherein said input means includes a plurality of input channels for receiving analog signals, each of said channels including an attenuator, a signal conditioning circuit and a comparator trigger circuit.

5. The device of claim 4 wherein each of said counter modules includes means for being reconfigured to function as a time base generator, a counter, an accumulator, an address register, a delay circuit and a timer.

6. The device of claim 5 wherein said configuration and control circuit means includes a plurality of command registers for receiving and decoding the command signals from said computer means and a plurality of counter control circuits for generating the required control signals for the counter modules in response to the decoded command signals.

7. The device of claim 6 wherein each of said counter control circuits provides clock, gate, synchronizing and reset control signals to said counter modules.

8. The device of claim 7 wherein each of said counter control circuits further provide run, arm and stop control signals to said counter modules.

9. The device of claim 8 wherein said configuration and control circuit further includes an auto-ranging circuit means for providing auto-ranging control signals to said counter modules.

10. The device of claim 6, further including analog to digital converter means coupled between at least one of said input channels and said memory interface circuit means.

11. The device of claim 10 further including a digital to analog converter means coupled between said memory interface means and an analog output means.

12. The device of claim 11 wherein said plurality of input channels includes first, second and third programmable input channels and wherein said plurality of counter modules includes first, second and third groups of counter modules, the first group including two counter modules, the second group including one counter module and the third group including three counter modules.

13. The device of claim 12 wherein the first counter module group is configured as a gate time base generator, the second counter group is configured as an extra accumulator for ratio measurements and the third counter group is configured as an accumulator in communication with the computer, said counter modules being interconnected to form said counter/timer, whereby a plurality of counting measurements are performed on the input signals presented to said input channels.

14. The device of claim 12 wherein said first input channel is programmed by said computer means as a trigger input and said second input channel is programmed by said computer means as a gate enable input, said first counter group is configured as trigger delay generator, said second counter group is configured as an iteration counter and said third counter group is configured as a segment duration time base generator and a memory address counter, said memory means storing a plurality of predetermined waveform functions, said counter modules and said memory means being interconnected to form said arbitrary function generator, whereby a selected waveform function is reproduced in a selected number of segments through said digital to analog converter means and said analog output means.

15. The device of claim 14 wherein said memory means stores a plurality of digital pulses thereby converting said device into a pulse generator.

16. The device of claim 12 wherein said first counter group is configured as a trigger delay generator, said second counter group is configured as an iteration counter and said third counter group is configured as a time between samples time base generator and a memory address counter, said counter modules and said memory means being interconnected to form said digitizer whereby an analog signal presented on said first input channel is routed to said analog to digital converter means and stored in said memory means as a digital signal configured according to a selected digitizing rate.

17. The device of claim 1 wherein said memory means comprises a high speed 1K by 40 memory array.

18. The device of claim 17 wherein said high speed 1k by 40 memory array comprises four 1k by 10 memory arrays, each array being time division multiplexed.

19. A reconfigurable signal processing device comprising:
(a) a programmable input means capable of accepting input signals over a wide range of amplitude and frequency, said programmable input means further comprising means for automatically limiting signals of amplitude and frequency beyond said programmable input means capability and providing these signals for processing;
(b) a plurality of programmable counter modules, each of said counter modules being reconfigurable to perform one of a plurality of selected signal processing functions on said input signals, said plurality of programmable counter modules are reconfigurable as a counter/timer, and arbitrary function generator, and a digitizer to digitize input waveforms:
(c) configuration and control circuit means, coupled to said input means, to a computer means and to said plurality of counter modules for providing control signals in response to command signals from said computer means and to operate on signals from the input means to detect specific characteristics of those signals and selectably apply those detected characteristics to interconnect said plurality of counter modules to form a selected signal processing device;
(d) memory means coupled to said input means, to at least one of said counter modules, and to said computer means for performing required memory functions corresponding to the selected signal processing device formed by said configuration and control circuit means;
(e) data conversion means coupled to said input means, computer means, counter modules and memory means to convert the form of incoming signals of an analog nature to a digital form and to convert memory signals of a digital nature to an analog form for selected signal processing.

* * * * *

UNITED STATES PATENT AND TRADEMARK OFFICE
CERTIFICATE OF CORRECTION

PATENT NO. : 5,081,297
DATED : January 14, 1992
INVENTOR(S) : Joseph A. Lebel, et al.

It is certified that error appears in the above-identified patent and that said Letters Patent is hereby corrected as shown below:

Column 18, Line 64, after "single" delete "b".

Column 21, Line 24, after "to" delete "L".

Column 23, Line 16, "bu" should read as --by--.

Column 23, Line 36, after "digitize" insert --input--.

Column 23, Line 47, before "least" insert --at--.

Signed and Sealed this

Seventeenth Day of August, 1993

Attest:

BRUCE LEHMAN

Attesting Officer

Commissioner of Patents and Trademarks